US012717798B2

(12) United States Patent
Gadit et al.

(10) Patent No.: US 12,717,798 B2
(45) Date of Patent: Aug. 25, 2026

(54) GENERATIVE SEARCH RESULTS DOCUMENTS BASED ON ENHANCED SEARCH RESULTS USING GENERATIVE ARTIFICIAL INTELLIGENCE (AI) MODELS

(71) Applicant: Microsoft Technology Licensing, LLC, Redmond, WA (US)

(72) Inventors: Mohamed Salman Ismail Gadit, San Jose, CA (US); Elbio Renato Torres Abib, Bellevue, WA (US); Andrew Peter Oakley, Seattle, WA (US); Nathan James Chalmers, Seattle, WA (US); Ming Gong, Beijing (CN); Wenbiao Ding, Beijing (CN); Aparna Rajaraman, Woodenville, WA (US); Baoquan Fan, Beijing (CN); Lile Palma Hattori, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 19/067,307

(22) Filed: Feb. 28, 2025

(65) Prior Publication Data

US 2026/0187080 A1 Jul. 2, 2026

Related U.S. Application Data

(60) Provisional application No. 63/740,875, filed on Dec. 31, 2024.

(51) Int. Cl.

*G06F 16/20* (2019.01)
*G06F 16/2457* (2019.01)
(Continued)

(52) U.S. Cl.

CPC ........ *G06F 16/24578* (2019.01); *G06F 16/93* (2019.01); *G06F 16/955* (2019.01); (Continued)

(58) Field of Classification Search

CPC ........... G06F 16/24534; G06F 16/2458; G06F 16/24578; G06F 16/93; G06F 16/955; G06F 16/9558; G06F 30/27; G06F 40/134

See application file for complete search history.

(56) References Cited

U.S. PATENT DOCUMENTS

| | | | | |
|---|---|---|---|---|
| 8,930,339 B2 * | 1/2015 | Song | ..................... | G06F 16/951 707/723 |
| 2021/0209102 A1 * | 7/2021 | Dinh | ........................ | G06N 5/04 |

(Continued)

*Primary Examiner* — Diedra McQuitery

(74) *Attorney, Agent, or Firm* — Ray Quinney & Nebeker P.C.; Christopher K. Hallstrom

(57) ABSTRACT

This disclosure describes utilizing a generative document system to dynamically build and provide generative search results documents using various small generative artificial intelligence (AI) models. For example, the generative document system efficiently utilizes small generative AI models to identify enhanced search results (e.g., deep search results) and determine when creating a generative document is needed to effectively answer the search query. In these cases, the generative document system utilizes search results to determine intent, generate a directed answer, curate topic sections, and create a generative search results document for the search query. In addition to improving efficiency by utilizing multiple small generative AI models, the generative document system performs many actions concurrently to generate and return generative search results documents more quickly in response to search queries.

20 Claims, 13 Drawing Sheets

(51) Int. Cl.

| | |
|---|---|
| ***G06F 16/93*** | (2019.01) |
| ***G06F 16/955*** | (2019.01) |
| ***G06F 30/27*** | (2020.01) |
| *G06F 16/2453* | (2019.01) |
| *G06F 16/2458* | (2019.01) |
| *G06F 40/134* | (2020.01) |

(52) U.S. Cl.

CPC .......... *G06F 16/9558* (2019.01); *G06F 30/27* (2020.01); *G06F 16/24534* (2019.01); *G06F 16/2458* (2019.01); *G06F 40/134* (2020.01)

(56) References Cited

U.S. PATENT DOCUMENTS

| | | | | |
|---|---|---|---|---|
| 2024/0289407 | A1* | 8/2024 | Rofouei | G06F 16/9577 |
| 2025/0124264 | A1* | 4/2025 | Wang | G06F 40/166 |
| 2025/0328594 | A1* | 10/2025 | Gudla | G06F 16/9538 |

* cited by examiner

Figure 4:
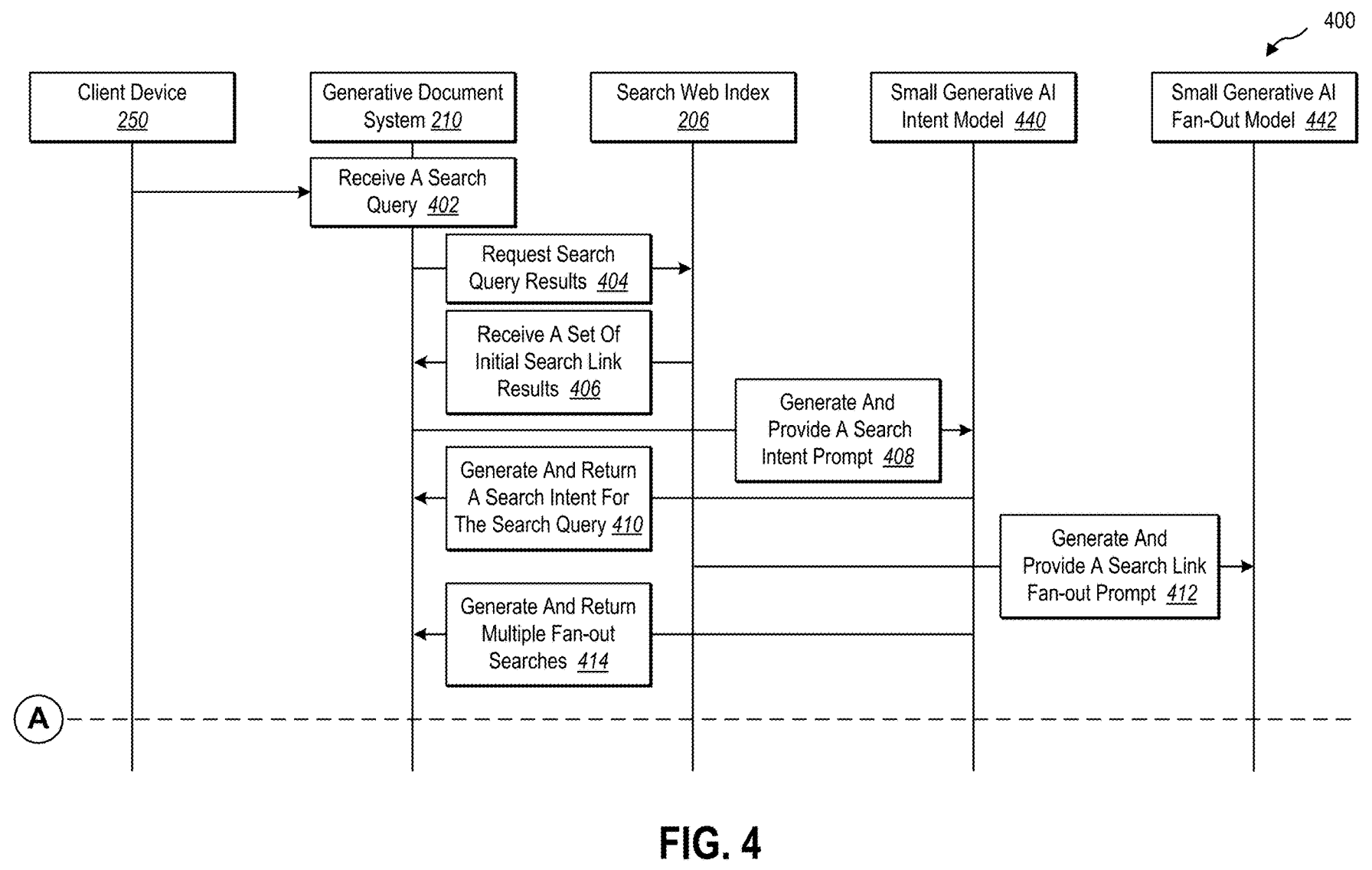

400

Client Device 250

Generative Document System 210

Search Web Index 206

Small Generative AI Intent Model 440

Small Generative AI Fan-Out Model 442

Receive A Search Query 402

Request Search Query Results 404

Receive A Set Of Initial Search Link Results 406

Generate And Provide A Search Intent Prompt 408

Generate And Return A Search Intent For The Search Query 410

Generate And Provide A Search Link Fan-out Prompt 412

Generate And Return Multiple Fan-out Searches 414

GENERATIVE SEARCH RESULTS DOCUMENTS BASED ON ENHANCED SEARCH RESULTS USING GENERATIVE ARTIFICIAL INTELLIGENCE (AI) MODELS

CROSS-REFERENCE TO RELATED APPLICATIONS

This application claims benefit and priority to Provisional Application No. 63/740,875, filed on Dec. 31, 2024, the entirety of which is incorporated herein by reference.

BACKGROUND

In recent years, there have been significant advancements in both hardware and software domains, specifically in the field of internet search. Current systems are designed to retrieve and present lists of links and resources in response to user search queries. These systems also offer direct answers for frequently searched topics. However, as the number of accessible resources continues to grow, existing systems have limitations in providing useful and relevant answers without requiring significant user effort. Furthermore, despite recent advancements and improvements, existing systems face technical challenges in discovering results and providing prompt and accurate query responses from these top search results due to the ever-growing amount of available information. These and other issues are present in current search result systems.

BRIEF DESCRIPTION OF THE DRAWINGS

The following detailed description provides specific implementations accompanied by drawings. Additionally, each of the figures listed below corresponds to one or more implementations discussed in this disclosure.

FIG. 4 illustrates an example sequence diagram for determining initial search link results and search intent.

DETAILED DESCRIPTION

Figure 1:
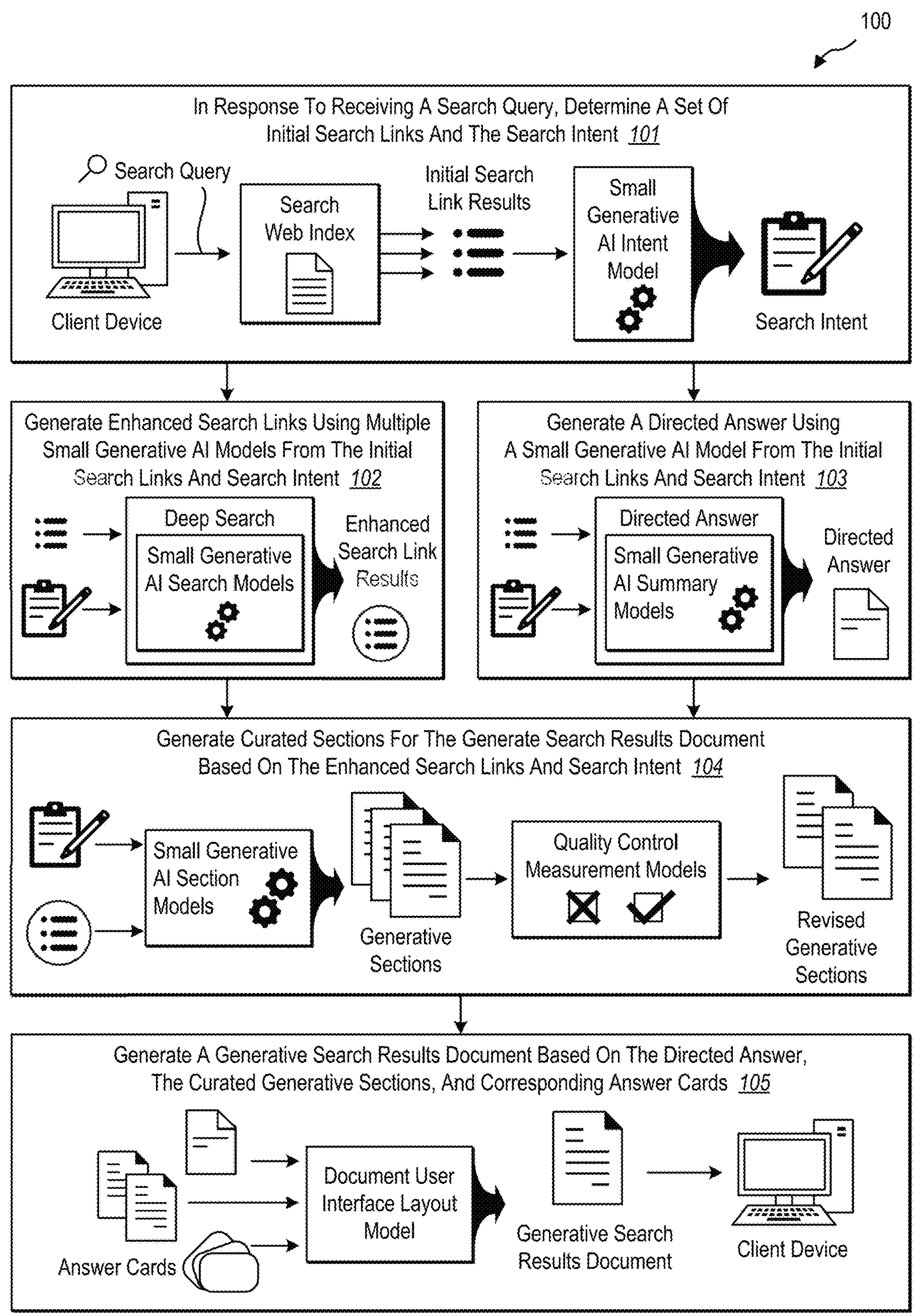
FIG. 1 illustrates an example overview of the generative document system using small generative artificial intelligence (AI) models to create a generative search results document for a search query.

This disclosure describes utilizing a generative document system to dynamically build and provide generative search results documents using various small generative artificial intelligence (AI) models. For example, the generative document system efficiently utilizes small generative AI models to identify enhanced search results (e.g., deep search results) and determine when creating a generative document is needed to effectively answer the search query. In these cases, the generative document system utilizes search results to determine intent, generate a directed answer, curate topic sections, and create a generative search results document for the search query. In addition to improving efficiency by utilizing multiple small generative AI models, the generative document system performs many actions concurrently to generate and return generative search results documents more quickly in response to search queries.

Implementations of the present disclosure provide benefits and solve problems in the art with systems, computer-readable media, and computer-implemented methods that utilize the generative document system to curate and build generative search results documents from search queries and enhanced search link results using multiple small generative AI models. As described below, the generative document system utilizes one or more search systems and generative AI models to leverage different outputs to build a generative search results document that includes a directed answer, generative topic sections, and linked citations. In various implementations, the generative search results document serves as the foundation for generating a multimedia generative document, which provides an enhanced user interface for providing enhanced and in-depth search result information in a streamlined and understandable format.

As an example of the generative document system generating search results documents using one or more artificial intelligence (AI) models, in various implementations, in response to receiving a search query, a set of initial search link results, and a search intent associated with the search query, the generative document system determines that the search query meets a generative document threshold. In response to the search query, the generative document system also determines a set of enhanced search link results for the search query based on the set of initial search link results and the search intent.

In addition, the generative document system determines a directed answer for the search query based on the set of initial search link results and the search intent concurrent with determining the set of enhanced search link results. The generative document system then determines generative content sections for a generative search results document based on the set of enhanced search link results. Additionally, the generative document system generates the generative search results document by combining the directed answer and curated versions of the generative content sections.

As described in this disclosure, the generative document system delivers several significant technical benefits in terms of improved accuracy, efficiency, and flexibility compared to existing search result systems. Moreover, the generative document system provides several practical applications that address problems related to providing search results in response to search queries.

To better understand the technical benefits of the generative document system, consider some existing search result systems. Some existing systems display responses in the form of a Search Engine Results Page (SERP) in response to a user's web search query. A SERP includes a list of results that are relevant to the search query. In their early stages, search result systems simply provided a series of hyperlinks correlated with the user's search terms in a SERP. More recent search result systems, in some situations, provide SERPs that also include responses to frequently queried subjects. Despite these advancements, current systems face technical challenges.

As mentioned earlier, the generative document system creates generative search results documents that provide streamlined, dynamic, and comprehensible answers to search queries. In various implementations, generative search results documents include accurate and efficient curations of enhanced search link results cited within the curated text. In some instances, these enhanced search link results are also provided alongside the generative search results documents. In various implementations, the generative document system creates improved SERPs that include a generative search results document and corresponding enhanced search link results.

The generative document system improves the efficiency of computing systems by utilizing small generative AI models to determine enhanced search link results as well as generate curated generative search results documents. To elaborate, the generative document system determines highly accurate enhanced search result links. By using a small generative AI model trained to identify enhanced links, the generative document system significantly improves computing efficiency (including using less computing resources) over systems that use much larger, more complex, and/or different models to achieve similar results. Furthermore, by using different small generative AI models fine-tuned to perform various parts of the generative document-creating process, the generative document system further improves the efficiency of generating generative search results documents from the enhanced search result links.

The generative document system also achieves improved computational efficiencies by employing gatekeeping thresholds and parallel operations. For example, by using a generative document threshold for search queries, the generative document system does not waste computational resources on search queries that do not warrant a generative document. Furthermore, by running operations in parallel, such as determining the set of enhanced search link results and a directed answer for the search query, the generative document system increases the response time for providing the generative document in response to the search query.

By using small generative AI models to build generative search results documents from enhanced search link results for a search query, the generative document system improves the efficiency and accuracy of providing search results. For example, the generative document system uses a set of small generative AI models to generate narrative responses from enhanced search link results within a curated generative search results document that includes a directed answer, curated topics associated with the search query, and linked citations. In some instances, the generative document system uses the generative search results document to match textual narrative responses with curated answer cards that provide additional relevant information in the form of targeted and interactive answers.

In addition, the generative document system builds upon the outputs of multiple calls or prompts made to various specialized small generative AI models. For example, the generative document system calls upon multiple small generative AI models with different prompts. Indeed, the generative document system efficiently leverages different features and functions of the small generative AI models to create outputs that can be compounded to improve accuracy at each stage and to efficiently construct a highly dynamic, streamlined, and valuable generative search results document in response to a search query.

In some implementations, the generative document system improves efficiency by reusing generative search results documents for recurring search result lists. For example, a generative search results document is created based on a set of enhanced search link results retrieved in response to a search query. When the same or a similar search query is repeated by the same or another user and results in the same or a similar set of enhanced search link results, the generative document system can efficiently and accurately reuse the same generative search results document without making additional calls to the generative AI models. When the set of search results differs beyond a threshold amount, the generative document system can update the generative search results document to ensure accurate results are provided in response to a search query.

The generative document system also provides flexibility over existing systems. As mentioned earlier, the generative document system leverages different features of one or more small generative AI models to generate multiple output formats. For example, the generative document system uses a chain of generative model outputs from earlier steps as model inputs in later steps to skillfully create elements needed to build the final formatted generative search results document.

As illustrated in the preceding discussion, this disclosure uses a variety of terms to describe the features and advantages of one or more described implementations. For instance, this disclosure describes the generative document system within the context of a cloud computing system.

As an example, an "artificial intelligence model" (generative AI model) is an artificial intelligence system that utilizes deep learning and a large number of parameters (e.g., in the billions or trillions), which are trained and/or fine-tuned on one or more extensive datasets to produce coherent, contextually relevant, and fluently topic-specific outputs (e.g., text and/or images). In many instances, a generative model refers to an advanced computational system that uses natural language processing, machine learning, and/or image processing to generate coherent and contextually relevant human-like responses.

As another example, a "small generative AI model" refers to a smaller version of an artificial intelligence system that utilizes significantly fewer parameters than large generative AI models. For example, a small generative AI model uses 1.5 billion parameters (as opposed to the 7 billion parameters of a large generative AI model). Additionally, in contrast to large models that perform tasks generally, a small generative AI model is fine-tuned to perform specific or specialized tasks. For instance, different small generative AI models are fine-tuned to perform varying operations to create a generative document, as described below. In some instances, a small generative AI model performs a broad range of applications but lacks the stored memory or internal data recall abilities of large generative AI models.

Generative AI models (both large and small) have applications in natural language understanding, content generation, text summarization, dialogue systems, language translation, creative writing assistance, image generation, audio generation, and more. A single generative AI model often performs a wide range of tasks by receiving different inputs, such as prompts (e.g., input instructions, rules, example inputs, example outputs, and/or tasks), data, and/or access to data. In response, the generative AI model generates various output formats, ranging from one-word answers to long narratives, images and videos, labeled datasets, documents, tables, and presentations.

Moreover, generative AI models are primarily based on transformer architectures for understanding, generating, and manipulating human language. Generative AI models can also utilize other types of architectures such as recurrent neural networks (RNNs), long short-term memory (LSTM) models, convolutional neural networks (CNNs), or other architectures. Examples of generative AI models include generative pre-trained transformer (GPT) models like GPT-3.5, GPT-4, and GPT-4o, bidirectional encoder representations from transformers (BERT) models, text-to-text transfer transformer models like T5, conditional transformer language (CTRL) models, and Turing-NLG. Other types of generative AI models include sequence-to-sequence models (Seq2Seq), vanilla RNNs, and LSTM networks. In some instances, a generative AI model includes a large language model (LLM), a small language model (SLM), and a small action model (SAM), which serve as text-based versions of generative AI models that receive text prompts and/or generate text outputs. In various implementations, a generative AI model is a multimodal generative model that receives multiple input formats (e.g., text, images, video, and data structures) and/or generates multiple output formats.

As an example, the terms "prompt," "model prompt," or "generative AI model prompt" refer to a request provided to a generative AI model to create a generative AI model output based on plain language guidance. In some instances, the generative document system provides additional information with a prompt. A prompt can include a user-level prompt that includes a user request or a system-level or meta-level prompt that provides important contextual information and/or general framing information to ensure that the generative AI model understands the correct context, syntax, and grounding information of the data it is processing. Examples of prompts include a search intent prompt that includes instructions to generate a set of topic sections based on a set of search link results corresponding to a search query, a topic section prompt that includes instructions to generate a curated topic section with text and linked citations, and a generative document prompt that includes instructions to generate a generative search results document with a directed answer followed by one or more curated topic sections.

As an example, the term "search link results" refers to links (e.g., hyperlinks) and their corresponding resources that are obtained in response to a search query (e.g., a user-requested search query). "Enhanced search link results" refer to a set of distilled search links that highly correlate to one or more search intents of the search query. Often, one or more generative AI models are used to determine enhanced search link results from a large number of search link results.

In various implementations, providing enhanced search link results to a generative AI model enables the model to access resources, summaries, and/or metadata associated with the links. In various implementations, a set of enhanced search link results includes a ranked order of results based on scores given to each result according to its correlation with a search query. Enhanced search link results can include any number of results corresponding to a search query.

As an example, the term "generative search results document" refers to a search-based document that includes curated text narrative responses corresponding to a search query and its corresponding set of search link results. In many implementations, a generative search results document includes topic sections that correspond to a search query and a set of search link results based on the search query. For example, topic sections include responses that answer portions of a search query and/or alternative search queries. In some instances, a topic section is curated, meaning it is generated by a generative AI model to provide one or more sentences that include streamlined information about the topic supported by citations linked to the search link results.

As another example, the term "answer card" refers to an element that provides direct answers to a search query or sub-queries derived from the search query. Answer cards provide quick, accurate answers to questions without requiring further search or interaction by a user. Answer cards can include text, images, audio, video, and/or animations to convey a quick answer. In addition, answer cards may include various versions that include different granularities of information and/or have different layout dimensions (e.g., available dimensions). Furthermore, answer cards include metadata and/or other grounding information to allow a generative AI model to understand the context associated with the card.

Implementation examples and details of the generative document system are discussed in connection with the accompanying figures, which are described next. For example, FIG. 1 illustrates an overview of the generative document system using small generative artificial intelligence (AI) models to create a generative search results document for a search query according to some implementations. While FIG. 1 provides a high-level overview of the invention, additional details are provided in subsequent figures.

FIG. 1 illustrates a series of acts 100 performed by or following directions from the generative document system. As shown, the series of acts 100 briefly illustrates an example of how the generative document system uses small generative AI models to generate outputs that are combined to build or create a generative search results document.

As shown, the series of acts 100 includes act 101 of determining a set of initial search result links and a search intent in response to receiving a search query. For example, a client device provides a search query to the generative document system. In response, the generative document system utilizes a search web index to obtain an initial set of search link results. Then, using the search link results, the generative document system utilizes a small generative AI intent model that is fine-tuned to determine search intents from search result sets to determine one or more search intents for the search query. Additional details about generating initial search link results and search intents are provided in connection with FIG. 4.

Using the initial set of search link results and the search intent, the generative document system can perform multiple operations in parallel. To illustrate, act 102 includes generating enhanced search links using multiple small generative AI models from the initial search links and search intent. For example, the generative document system utilizes deep search functions that include various small generative AI models to determine enhanced search link results. Additional details about generating enhanced search link results with deep search are provided in connection with FIG. 5.

Concurrent with generating enhanced search link results, act 103 includes generating a directed answer using a small generative AI model based on the initial search links and the search intent. For example, if the search query merits a generative document, the generative document system utilizes directed answer functions that include a small generative AI summary model fine-tuned to generate short answers from user queries and corresponding search link results, thus creating a directed answer for the search query. Additional details about determining whether to create a generative document for a search query and generating directed answers are provided in connection with FIG. 6.

Act 104 includes generating curated sections for the generative search results document based on the enhanced search links and search intent. For example, the generative document system utilizes a set of small generative AI models, such as multiple small generative AI section models operating in parallel, to create generative sections from the enhanced search link results and search intent. In various implementations, the generative document system uses a section curator model to determine which sections to generate. Additionally, the generative document system further curates the sections using various quality control measurement models to prevent duplication, inaccuracies, unauthorized content, or broken content. Additional details about creating and curating generative sections are provided in connection with FIG. 7.

Act 105 includes generating a generative search results document based on the directed answer, the curated generative sections, and corresponding answer cards. For instance, the generative document system utilizes one or more answer card models to retrieve and match answer cards to curated generative sections. Additionally, based on the directed answer, the curated generative sections, and the answer cards, the generative document system determines and applies a document user interface layout. The generative document system then returns the generative search results document to the client device in response to the search query. Additional details about generating and providing the generative search results document are provided in connection with FIG. 8.

In various implementations, the process of generating a generative search results document occurs within ten seconds of receiving a search query. Indeed, while performing each operation serially may take the generative document system over a minute to create and return the generative search results document, by performing concurrent operations and using small generative AI models, the generative document system can quickly generate and return curated, customized, and highly accurate search results to a search query in a user-friendly interface document.

Figure 2:
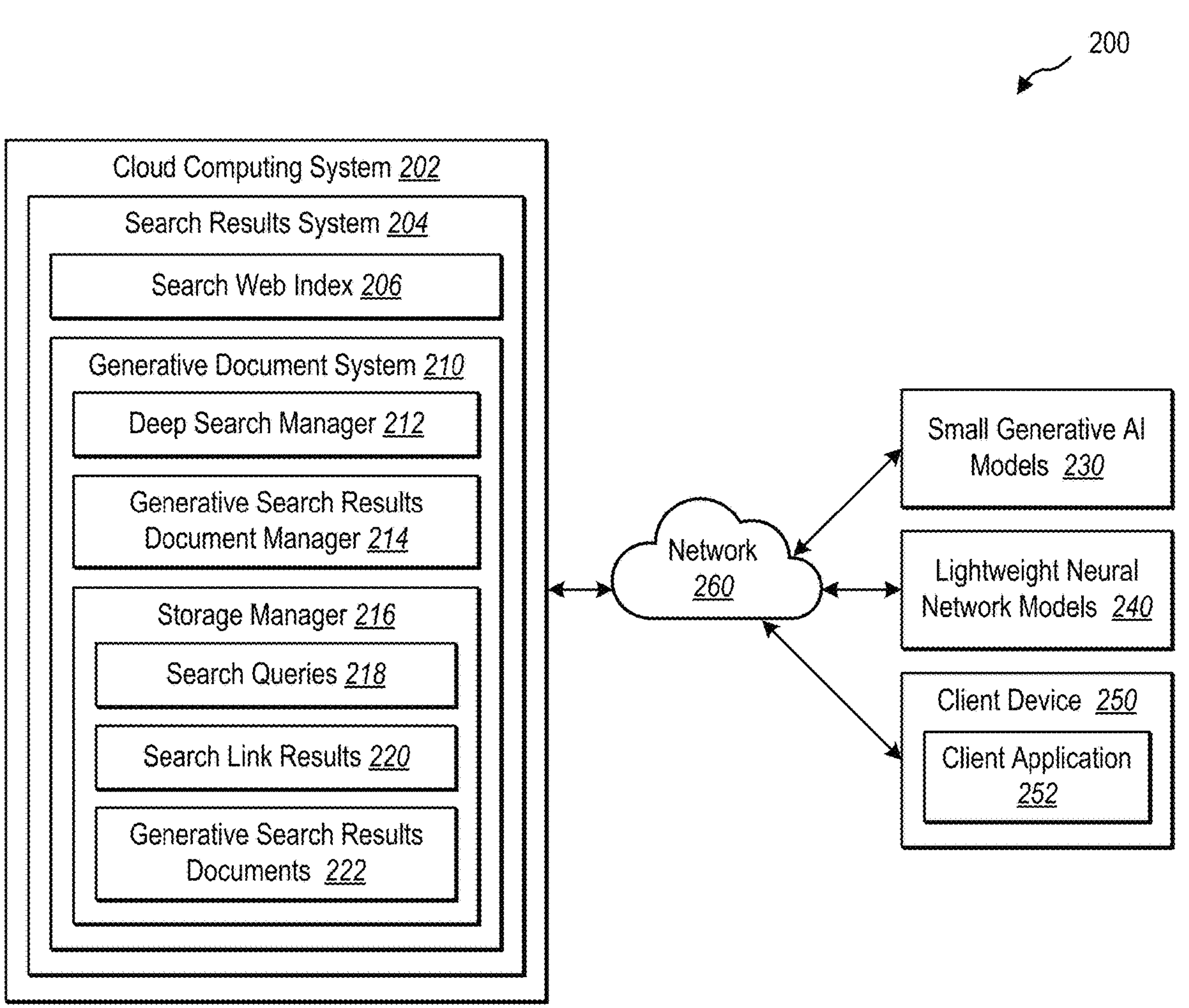
FIG. 2 illustrates an example computing environment where the generative document system is implemented.

With a general overview in place, additional details are provided regarding the components, features, and elements of the generative document system. To illustrate, FIG. 2 shows an example computing environment where the generative document system is implemented according to some implementations. In particular, FIG. 2 illustrates an example of a computing environment 200 with various computing devices including a cloud computing system 202 associated with a generative document system 210. While FIG. 2 shows example arrangements and configurations of the computing environment 200, the cloud computing system 202, the generative document system 210, and associated components, other arrangements and configurations are possible.

As shown, the computing environment 200 includes a cloud computing system 202 associated with the generative document system 210, small generative AI models 230, lightweight neural network models 240, and a client device 250 with a client application 252, connected via a network 260. Many of these components may be implemented on one or more computing devices, such as one or more server devices. Some of these components may be implemented on personal devices. Further details regarding computing devices are provided below in connection with FIG. 11, along with additional details regarding networks, such as the network 260 shown.

Before describing the components of the cloud computing system 202, including the generative document system 210, other components of the computing environment 200 are discussed first to provide better context for the generative document system 210. As shown, the computing environment 200 includes the small generative AI models 230 (SGMs), which correspond to different small models fine-tuned to efficiently perform various operations. For example, the small generative AI models 230 include a small generative AI model that is fine-tuned to determine search intents from search result sets, a small generative AI model that is fine-tuned to generate related search queries, a small generative AI model that is fine-tuned to score search results based on the search intents, a small generative AI model that is fine-tuned to generate short answers from user queries and the corresponding search link results, and small generative AI models that are fine-tuned to generate content sections from user queries and the corresponding search link results. In various implementations, the small generative AI models 230 create generative outputs (e.g., generative AI model outputs) of various types and/or formats based on prompt inputs (e.g., generative AI model prompts).

In some instances, the computing environment 200 may include one or more larger generative AI models (e.g., one or more large generative models (LGMs)). In some implementations, one of the small or large generative AI models is a text-based generative AI model or a large text-only generative model that inputs and outputs text data (e.g., no images or audio), which runs more efficiently and also returns results more quickly than multimodal-based models.

As shown, the computing environment 200 includes lightweight neural network models 240 (or machine learning models), which can perform various functions and operations. For example, the lightweight neural network models 240 can include a variety of computationally lighter models (e.g., models with thousands to millions of parameters). The lightweight neural network models 240 can assist in ensuring quality control, determining answer cards, and generating a user interface layout, among performing other operations. In some implementations, one or more of the lightweight neural network models 240 are implemented by or within the generative document system 210.

While not shown, in various instances, the computing environment 200 may include an answer card system that receives answer card requests and returns lists of candidate answer cards corresponding to a search query, topic, or portion of a search query. In some instances, the answer card system is one of the lightweight neural network models 240. In various implementations, a list or set of candidate answer cards is ranked according to quality, engagement, or another metric. Additionally, the answer card system provides properties such as display sizes, dimensions, media types, rendering metadata, and/or grounding data for one or more answer cards.

As shown, the computing environment 200 includes the client device 250. In various implementations, the client device 250 is associated with a user (e.g., a user client device), such as a user who requests a search query. In various instances, the client device 250 includes a client application 252, such as a web browser, mobile application, or another form of computer application for accessing and/or interacting with the cloud computing system 202 and/or the generative document system 210. For example, the client device 250 interacts with generative content (e.g., text narrative responses and corresponding answer cards) within a formatted generative search results document via the client application 252.

Returning to the cloud computing system 202, as shown, the cloud computing system 202 includes a search results system 204 having a search web index 206 and the generative document system 210. In various implementations, the search results system 204 provides search results in response to a search query. For example, the client device 250 submits a search request, and the search results system 204 returns search link results provided by the search web index 206, a generative search results document generated by the generative document system 210, and/or additional generative content.

Regarding the search web index 206, in various implementations, the search web index 206 returns a set of search link results (and/or other search grounding information) in response to a search request. In various implementations, a set of search results includes one or more ranked search link results. In some implementations, the search web index 206 is used to return linked content and answers along with search link results in response to a search query.

Regarding the generative document system 210, as shown, the generative document system 210 includes various components and elements that are implemented in hardware and/or software. For example, the generative document system 210 includes a deep search manager 212, a generative search results document manager 214, and a storage manager 216. The storage manager 216 includes search queries 218, search link results 220, and generative search results documents 222.

As mentioned, the generative document system 210 includes the deep search manager 212, which communicates with the small generative AI models 230 and/or the lightweight neural network models 240 (or machine learning models) to generate search link results 220 corresponding to search queries 218. In some implementations, the deep search manager 212 also communicates with the search web index 206 to determine search link results 220. Search queries 218 can include a search query (i.e., a main query), topic section queries, and alternative topic section queries. In some implementations, the deep search manager 212 obtains only a set of search link results as grounding information. In other instances, the deep search manager 212 obtains search link results, linked content, and/or answers as grounding information. In various implementations, the deep search manager 212 generates enhanced search link results that are the top-ranked results from a set of search queries related to a user-submitted search query, as further described below.

The generative document system 210 includes the generative search results document manager 214, which builds generative search results documents 222, including curated topic sections. In various implementations, the generative document system 210 utilizes various small generative AI models, sometimes concurrently, to generate topic sections from determined search intents and enhanced search link results. Additionally, the generative search results document manager 214 creates generative search results documents 222 that provide a streamlined, organized, and curated response to the search query. In some implementations, the generative search results document manager 214 provides generative search results documents 222 to the search results system 204 to be displayed (e.g., as part of a search engine results page (SERP) shown on the client device 250) and/or provided to downstream applications.

In some implementations, the generative document system 210 is located on a separate computing device from the search results system 204 within the cloud computing system 202 (or apart from the cloud computing system 202). In various implementations, the search results system 204 operates without the generative document system 210.

Turning to the next set of figures, FIGS. 3-8 illustrate example diagrams that focus on different interactions between the generative document system 210, small generative AI models 230, and lightweight neural network models 240 to build a generative search results document. In part, these figures show different communications (e.g., via the network 260) between the generative document system 210, the search web index 206, the small generative AI models 230, and the lightweight neural network models 240.

Figure 3:
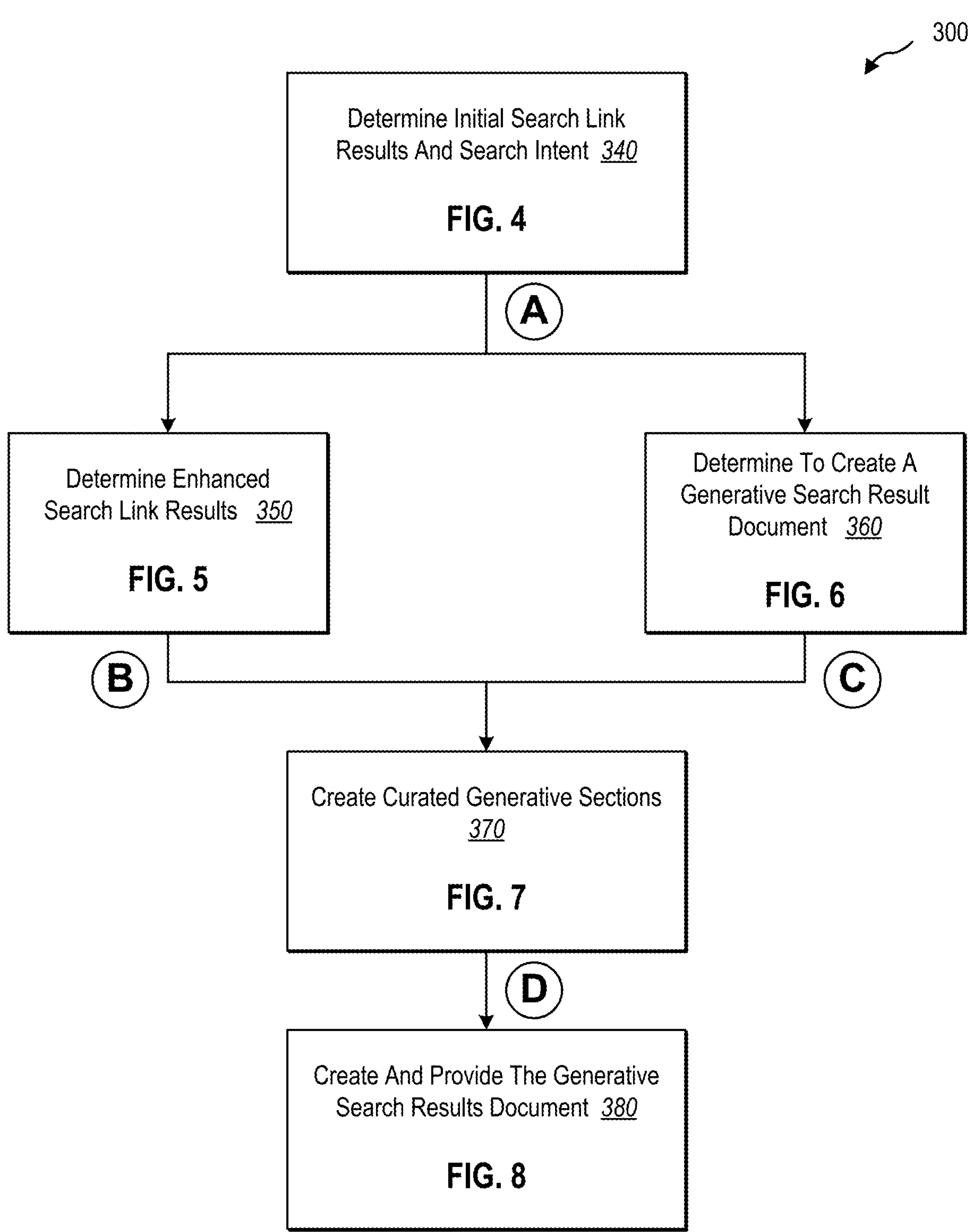
FIG. 3 illustrates an example overview of actions by the generative document system in creating a generative search results document as shown in FIGS. 4-8.

To begin, FIG. 3 illustrates an example overview of actions by the generative document system in creating a generative search results document as shown in FIGS. 4-8. As shown, FIG. 3 includes a series of acts 300 that corresponds to high-level actions for generating a generative search results document. For the purpose of explanation, each act in the series of acts 300 corresponds to one of FIGS. 4-8. In addition, the series of acts 300 includes checkpoint letters (e.g., circled letters A-D) to assist in illustrating the flow of actions between FIGS. 4-8.

As shown, the series of acts 300 begins with act 340 of determining initial search result link results and search intent. For instance, in response to a search query, the generative document system 210 determines both a set of initial search results as well as one or more search intents, as further described in FIG. 4.

The series of acts 300 then continues with act 350 of determining enhanced search link results and act 360 of determining to create a generative search results document. Act 350 corresponds to the generative document system 210 using the initial search link results and search intent with various small generative AI models to determine enhanced search link results, as further described in connection with FIG. 5. Act 360 corresponds to the generative document system 210 using the initial search link results and search intent to determine that the search query merits a generative search results document, as further described in connection with FIG. 6. In many implementations, act 350 and act 360 are performed concurrently, as shown.

The series of acts 300 also includes act 370 of creating curated generative sections. For example, when the generative document system 210 determines to generate a generative search results document for the search query, the generative document system 210 uses the enhanced search link results along with additional small generative AI models to generate sections for the generative document. In addition, the generative document system 210 can curate the generative sections and ensure that quality check measurements are enforced, as further described in connection with FIG. 7. In some instances, the generative document system 210 begins forming generative sections based on the initial search link results (while the enhanced search link results are still being generated) and then refines the generative sections based on the enhanced search link results.

Furthermore, the series of acts 300 includes act 380 of creating and providing the generative search results document. For example, the generative document system 210 combines the curated generative sections with additional generated information and/or matched answer cards according to a customized user interface layout to generate a generative search results document in response to the search query, as further described below in connection with FIG. 8.

In various implementations, the generative document system 210 provides the generative search results document to the requesting client device in response to the search query.

As mentioned above, FIG. 4 provides additional details about determining initial search result link results and search intent. In particular, FIG. 4 illustrates an example sequence diagram for determining initial search link results and search intent according to some implementations. As shown, FIG. 4 includes a series of acts 400 performed by, or under the direction of, the generative document system 210 in connection with the client device 250, the search web index 206, a small generative AI intent model 440, and a small generative AI fan-out model 442. As mentioned previously, the series of acts 400 corresponds to act 340 introduced above in FIG. 3.

As shown, the series of acts 400 begins with act 402 of receiving a search query from the client device 250. For example, based on a user's interaction, the client device 250 sends a search query requesting search results for a specific topic or question. For instance, the user enters a search question into the search field of a search engine via a web browser.

Act 404 shows the generative document system 210 requesting search query results from the search web index 206. In response, the search web index 206 provides the generative document system 210 with a set or list of links (e.g., search link results) to websites and/or resources corresponding to the search query. Act 406 includes the generative document system 210 receiving a set of initial search query results from the search web index 206. In various implementations, the search web index 206 quickly provides only the initial search link results without additional content or answers. In some implementations, the initial search link results include various pieces of grounding information associated with the initial search link results.

Act 408 shows the generative document system 210 generating a search intent prompt and providing the search intent prompt to the small generative AI intent model 440. In one or more implementations, the generative document system 210 creates a prompt that instructs the small generative AI intent model 440 to determine the search intent for the search query based on both the search query and the set of initial search link results. For example, the search intent prompt provides instructions for the small generative AI intent model 440 to analyze the search query and generate a set or list of candidate intents behind the search query and, in some instances, order the list by rank. In various implementations, act 408 includes providing the search intent prompt, along with the search query and the initial search link results, to the small generative AI intent model 440 (either within the search intent prompt or as separate data).

This and each prompt sent to a generative AI model may include or may be accompanied by a system prompt that includes guardrails that enforce responsible artificial intelligence (RAI) rules and policies. Additionally, each prompt sent to a generative AI model may include additional contextual information, such as language and region information.

Act 410 includes the small generative AI intent model 440 generating and returning a search intent for the search query. For example, the small generative AI intent model 440 processes the search query and the initial search link results to determine one or more search intents, including one or more alternative search intents. In some instances, the small generative AI intent model 440 ranks the generated search intents and returns one or more of the highest-ranked search intents for the search query.

In one or more implementations, the small generative AI intent model 440 is fine-tuned to determine search intents from search result sets. To elaborate, in some implementations, a small generative AI intent model is trained based on a larger trained generative AI model. For example, using a larger generative AI model, knowledge from the large pre-trained model is transferred to the smaller model via transfer learning by initializing the smaller model with the weights of the large model. In some implementations, the smaller model is then fine-tuned on a smaller, task-specific dataset, fine-tuned, and/or optimized using one or more optimization techniques. By doing so, the number of parameters may be reduced 3-4 times (e.g., from 7 billion parameters to 1.5 billion parameters), resulting in a smaller, more efficient, and quicker model.

While act 408 and act 410 include using the small generative AI intent model 440, in some implementations, the generative document system 210 provides the search intent prompt to a generative AI model and receives one or more search intents in response.

Act 412 includes the generative document system 210 generating a search link fan-out prompt and providing it to the small generative AI fan-out model 442. For instance, the search link fan-out prompt requests that the small generative AI fan-out model 442 determine alternative search queries that correspond to the search query. In some implementations, the generative document system 210 provides the search link fan-out prompt along with the search intent, the initial search link results, and the search query to the small generative AI fan-out model 442.

Act 414 includes the small generative AI fan-out model 442 generating and returning multiple fan-out searches. In various implementations, the small generative AI fan-out model 442 is fine-tuned to generate related search queries. For instance, the small generative AI fan-out model 442 uses the search query, search intent, and/or the initial search link results to determine alternative search queries (e.g., fan out the search query into additional related queries aligned with the search intent). For example, if the search query is "best time to visit Hawaii," the small generative AI fan-out model 442 may determine the alternative search queries corresponding to the cheapest time to travel, when the weather is best, when the best events occur, and other similar queries. In some implementations, the generative document system 210 utilizes a generative AI model to determine alternative search queries.

In various implementations, the generative document system 210 may perform the series of acts 400 in a short time. For example, from receiving the search query, the generative document system 210 obtains the initial search link results and the search intent within 1.5 seconds and obtains the fan-out search queries within 1.8 seconds of determining the search intent. Indeed, by using small generative AI models, the generative document system 210 can receive the above information very quickly.

Figure 5:
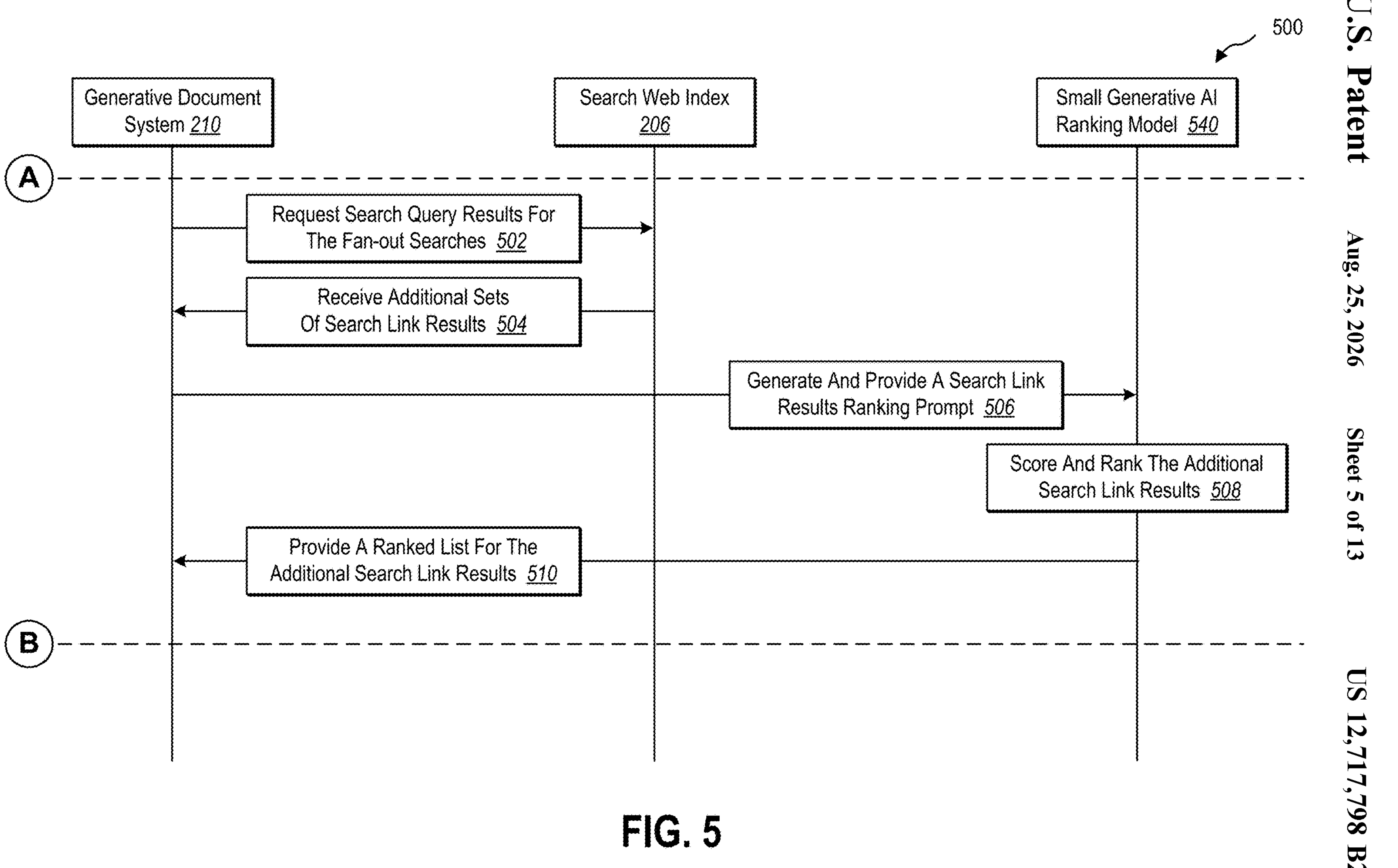
FIG. 5 illustrates an example sequence diagram for determining enhanced search link results.

As mentioned above, FIG. 5 provides additional details about generating enhanced search link results using deep search. In particular, FIG. 5 illustrates an example sequence diagram for determining enhanced search link results according to some implementations. As shown, FIG. 5 includes a series of acts 500 performed by, or under the direction of, the generative document system 210 in connection with the search web index 206 and a small generative AI ranking model 540.

The series of acts 500 corresponds to act 350 introduced above in FIG. 3. The series of acts 500 continues from the act 340, as indicated by Checkpoint A. In particular, the generative document system 210 has obtained the search query, the initial search link results, the search intent, and a set of fan-out searches (e.g., alternative search queries).

As shown, the series of acts 500 includes act 502 of the generative document system 210 requesting search query results for the fan-out searches from the search web index 206. In some instances, the generative document system 210 provides the fan-out searches in a bulk request. In various implementations, the generative document system 210 provides a request for each of the alternative search queries from the fan-out searches. For instance, the generative document system 210 provides each of the requests in parallel to the search web index 206.

Act 504 includes the generative document system 210 receiving additional sets of search link results from the search web index 206. For example, the search web index 206 determines a set of search results for each of the alternative search queries and returns the sets of search link results to the generative document system 210. To illustrate, if the generative document system 210 provides the search web index 206 with 5 alternative search queries, the search web index 206 can determine 50 additional search link results for each of the alternative search queries. In this example, the search web index 206 returns 250 additional search results to the generative document system 210.

Act 506 includes the generative document system 210 generating a search link results ranking prompt and providing the prompt to the small generative AI ranking model 540. In various implementations, the search link results ranking prompt includes instructions to analyze the sets of search link results and rank each result based on the search query and/or search intent. In various implementations, along with providing the search link results ranking prompt, the generative document system 210 also provides the search query, the search intent, and the additional sets of search link results to the small generative AI ranking model 540.

Act 508 includes the small generative AI ranking model 540 scoring and ranking the additional search link results. In various implementations, the small generative AI ranking model 540 is fine-tuned to score search results based on the search intents. For example, the small generative AI ranking model 540 generates a normalized and/or comparable score for some or all of the search link results by determining correspondences to the search query and/or search intent. In some instances, the scoring is influenced by which alternative search query the search link results belongs to and the correspondence score between the alternative search query and the search intent.

In addition, the small generative AI ranking model 540 ranks the links using the scores. In various implementations, the small generative AI ranking model 540 selects the top n search link results to return or indicate to the generative document system 210. To illustrate, continuing the above example, the small generative AI ranking model 540 scores and ranks the 250 additional search link results (or 300 if the 50 initial search link results are included). The small generative AI ranking model 540 then selects the top 5, 10, or another specified number (n) of results with the highest scores as the enhanced search link results.

Act 510 includes the small generative AI ranking model 540 providing a ranked list of the additional search link results to the generative document system 210. In various implementations, the small generative AI ranking model 540 generates and provides the top-n links as enhanced search link results to the generative document system 210. In some implementations, the client device 250 receives an indication of which links from the additional search link results are included in the enhanced search link results. Additionally, the total time to generate the enhanced search link results is approximately 6 seconds.

Figure 6:
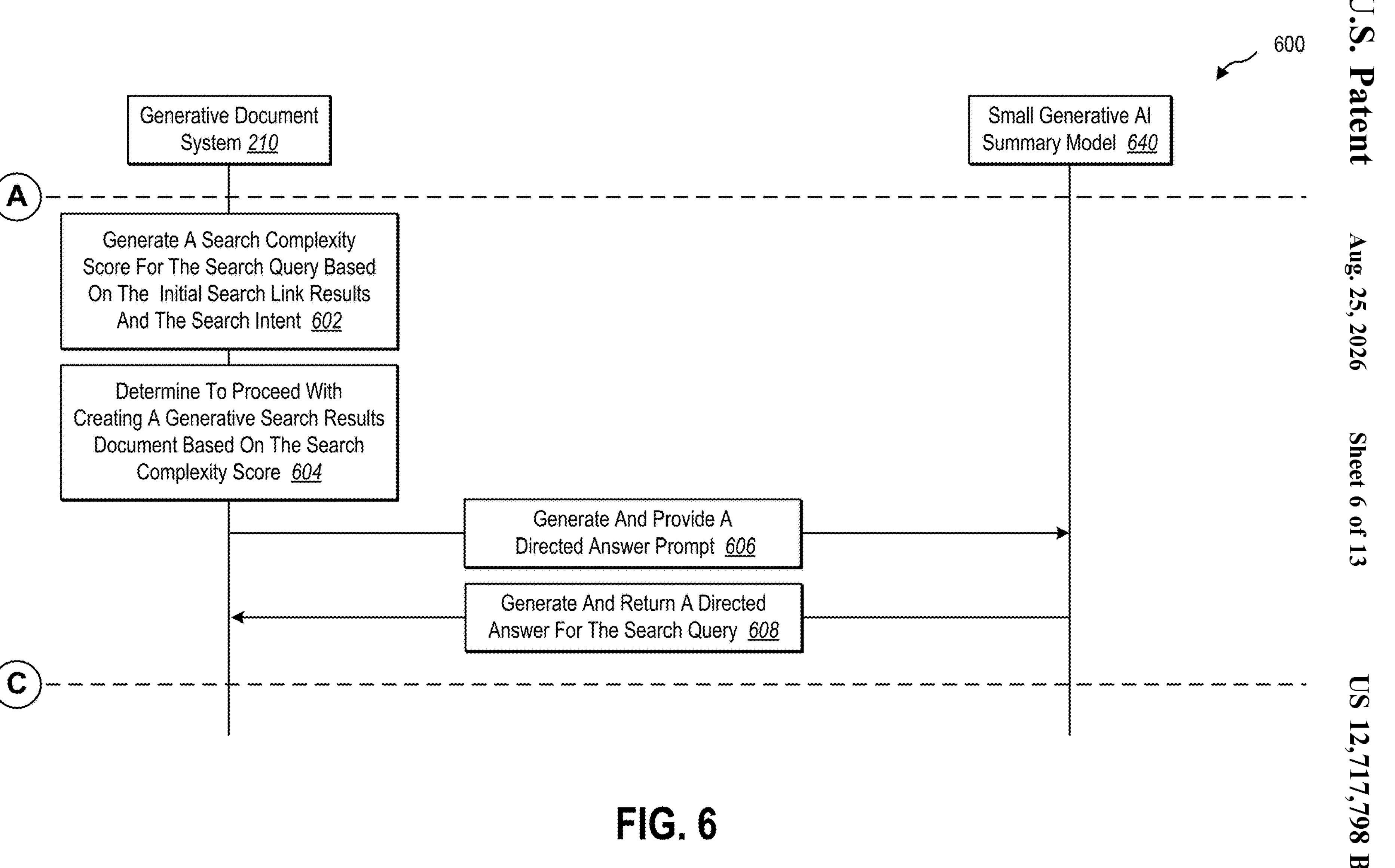
FIG. 6 illustrates an example sequence diagram for determining when to create a generative document.

As mentioned above, FIG. 6 provides additional details about determining whether to create a generative document for a search query and generating directed answers. In particular, FIG. 6 illustrates an example sequence diagram for determining when to create a generative document according to some implementations. As shown, FIG. 6 includes a series of acts 600 performed by, or under the direction of, the generative document system 210 in connection with a small generative AI summary model 640.

The series of acts 600 corresponds to act 360 introduced above in FIG. 3. The series of acts 600 also continues from act 340, as indicated by Checkpoint A. In particular, the generative document system 210 has obtained the search query, the initial search link results, the search intent, and a set of fan-out searches (e.g., alternative search queries).

As shown, the series of acts 600 includes act 602 of generating a search complexity score for the search query based on the initial search link results and the search intent. In various instances, search complexity represents the difficulty of obtaining and providing a satisfactory answer from a search query (e.g., answerability). Simple queries with direct answers, like "solve 2+2" or "youtube," receive a low score as they can be answered directly. In contrast, complex queries requiring additional research and evaluation, often from multiple sources, are assigned a high score (e.g., "analyze the impact of climate change on global agriculture").

In one or more implementations, the generative document system 210 processes the search query through one or more search complexity models or algorithms to determine a search complexity score. For instance, the generative document system 210 considers query specificity, whether the query has a straightforward answer or requires a synthesis of information, information availability, and answer complexity (e.g., the amount of effort needed to explain the answer) for the average user.

Act 604 includes determining to proceed with creating a generative search results document based on the search complexity score. In various implementations, the generative document system 210 compares the search complexity score to a search complexity threshold to determine whether the search query can be directly answered (without additional information) or if a generative document would better address the query. For example, when the search complexity score meets or exceeds the search complexity threshold value, the generative document system 210 decides to proceed with generating a generative document for the search query. Otherwise, if the search complexity score is below the search complexity threshold value, then the generative document system 210 determines not to provide enhanced search link results without creating a generative document and/or directly answering the search query.

In some implementations, act 602 and act 604 are combined into a single act. For example, the generative document system 210 utilizes a search complexity model or algorithm that uses a heuristic framework to determine whether to proceed with creating a generative search results document for the search query. By doing so, the generative document system 210 determines if the search query is worthy of a generative search results document.

Act 606 includes the generative document system 210 generating a directed answer prompt and providing the prompt to the small generative AI summary model 640. In various implementations, the directed answer prompt includes instructions to generate a directed answer to the search query. In one or more implementations, the generative document system 210 provides the initial search link results and the search intent along with the directed answer prompt to the small generative AI summary model 640.

Act 608 includes the small generative AI summary model 640 generating and returning the directed answer for the search query. In various implementations, the small generative AI summary model 640 is fine-tuned to produce short answers from user queries and corresponding search link results. For example, a directed answer, or a short answer, is a one- or two-sentence response that briefly addresses and answers the search query. In some implementations, the directed answer is the top answer proven to be a widely accepted response to the search query. In some implementations, the directed answer is a carousel/pole answer that includes multiple cards listing the cast of a movie in response to a search query about who was in the movie.

Accordingly, as shown in act 608, the small generative AI summary model 640 generates a directed answer from the search query, search intent, and the initial search link results and provides it to the generative document system 210. As mentioned above, the generative document system 210 may orchestrate generating the enhanced search link results and the directed answer concurrently to reduce wait time in providing a search query response. Furthermore, by using different small generative AI models, the generative document system 210 is able to perform various operations needed to generate the generative search results document more efficiently and quickly.

In some instances, the process of determining the directed answer occurs in fewer than 3 seconds. However, as noted above, the generative document system 210 may begin (or finish) determining the directed answer concurrently with generating the enhanced search link results.

Figure 7:
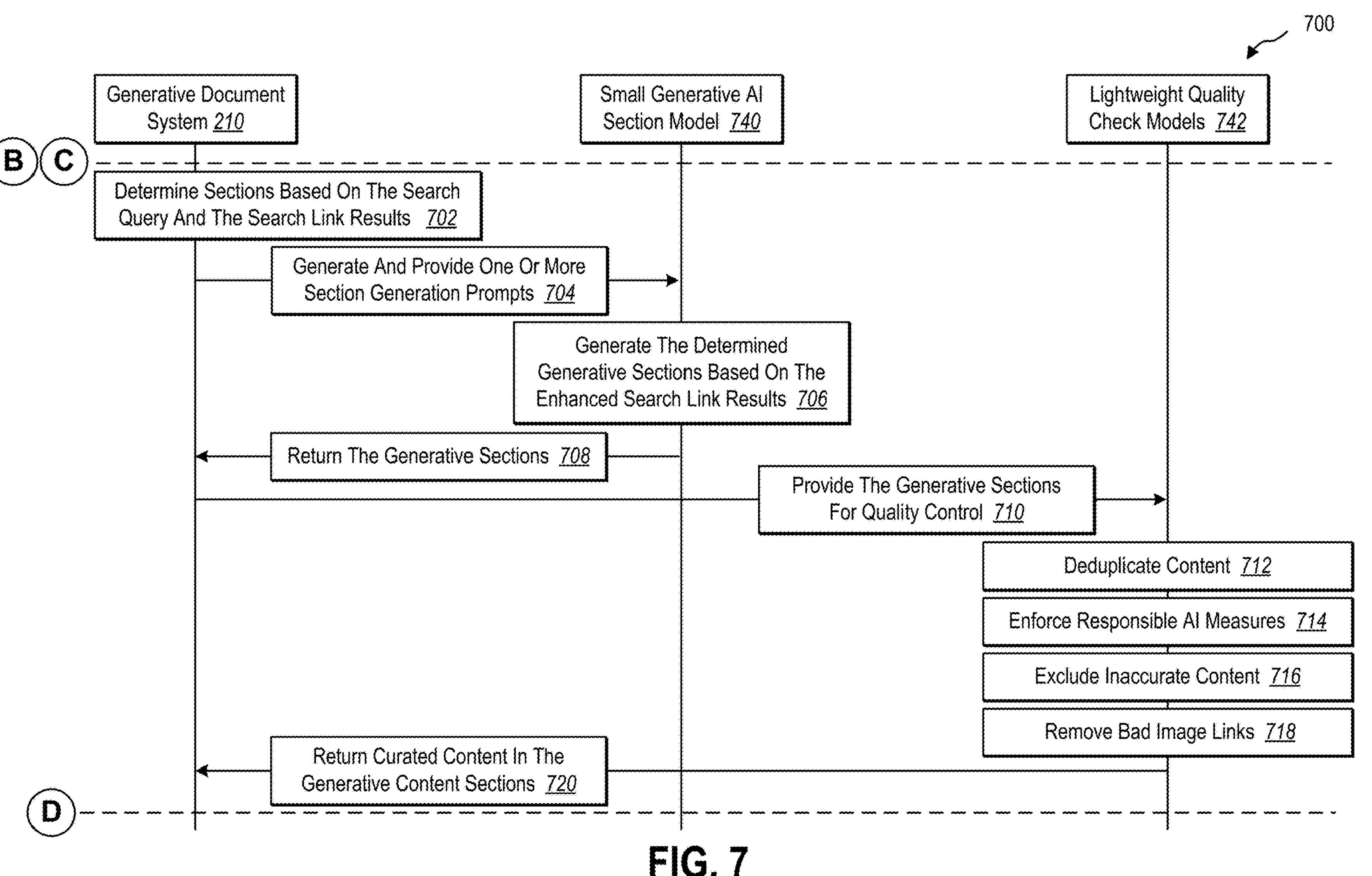
FIG. 7 illustrates an example sequence diagram for creating generative sections for a generative document.

As mentioned above, FIG. 7 provides additional details about creating and curating generative sections. In particular, FIG. 7 illustrates an example sequence diagram for creating generative sections for a generative document according to some implementations. As shown, FIG. 7 includes a series of acts 700 performed by, or under the direction of, the generative document system 210 in connection with a small generative AI section model 740 and lightweight quality check models 742.

The series of acts 700 corresponds to act 370 introduced above in FIG. 3. The series of acts 700 also continues from act 350, as indicated by Checkpoint B, as well as from act 360, as indicated by Checkpoint C. For instance, the generative document system 210 has obtained the enhanced search link results and the directed answer.

The series of acts 700 includes act 702 of determining sections based on the search query and the search link results. In various implementations, the generative document system 210 utilizes the enhanced search link results (or the initial search link results while waiting for some or all of the enhanced search link results) to determine a set of topics or sections to include in the generative document for the search query. For example, the generative document system 210 analyzes the enhanced search link results and generates a list of topic sections based on those search intents. In one or more implementations, the generative document system 210 utilizes a small generative AI model to determine topics for the generative search results document.

Act 704 includes the generative document system 210 generating one or more section generation prompts and providing the prompt(s) to the small generative AI section model 740. In some instances, a section generation prompt includes instructions for the small generative AI section model 740 to generate multiple topic sections by curating the provided grounding information (e.g., enhanced search link results) into a streamlined, digestible text response that includes linked citations. In some instances, the generative document system 210 generates a separate section prompt for each topic section to be created. In various cases, the prompt also includes example output samples and/or potential text output structures (e.g., paragraph, list, table, or another form).

Act 706 includes the small generative AI section model 740 generating the determined generative sections based on the enhanced search link results. For example, for a first section, the small generative AI section model 740 generates a topic title, topic sentence (e.g., a directed answer for the topic), topic answer, and/or topic narrative corresponding to the topic section based on the enhanced search link results, which are used as the information source and/or grounding information from which the section is generated. By using the enhanced search link results, the small generative AI section model 740 leverages the best and most accurate information available to generate a topic section.

In addition, the small generative AI section model 740 may determine an optimal format for the topic sentence. For example, the small generative AI section model 740 may include text, bullet points, images, animations, and/or videos in the topic section, depending on how the small generative AI section model 740 determines to best convey the information in the requested topic section. For instance, the text may include a single sentence or a short paragraph of a few sentences (e.g., 3-5 sentences). Furthermore, the generated text may utilize a natural language tone and style. In some cases, the small generative AI section model 740 generates a table or list as part of the generative topic section response.

Furthermore, in various implementations, act 706 is performed concurrently and/or in parallel using multiple instances of the small generative AI section model 740. For example, for each determined topic section, the generative document system 210 utilizes a separate instance of the small generative AI section model to generate the corresponding topic section. In this way, the generative document system 210 is able to obtain the topic sections in a short amount of time. Indeed, the links support the assertions made in the response to ensure topics are of high accuracy and linked content, which has the additional benefit of allowing a user to further explore the topic using the provided links.

In various implementations, the small generative AI section model 740 supplements the generative topic section with enriched content. In various implementations, the generative document system 210 utilizes the small generative AI section model 740 or other systems or models to further enrich a generative topic section. For example, enriched content may request additional queries (e.g., answer queries, section suggestions, personalization queries, and image queries) from small generative AI models or other systems and use the retrieved content (e.g., enriched grounding information) to enhance or enrich the target topic section. In some instances, the generative document system 210 uses the small generative AI section model 740 again to add the enriched content and/or enriched grounding information to the generative topic section.

In some instances, the total time for generating the topic is around 5.5 seconds, at least some of which overlaps with generating the enhanced search link results, keeping the total response time under 10 seconds.

Act 708 includes the small generative AI section model 740 returning the generated sections. In various implementations, in response to the section prompt, the small generative AI section model 740 generates a section and returns it to the generative document system 210. If additional small generative AI section models are also used to generate topic sections, they may similarly return the generated sections to the generative document system 210.

In some implementations, the generative document system 210 combines the received generative sections into a single combined topic section document. For example, the generative document system 210 concatenates each section into a data structure file or document.

Act 710 includes the generative document system 210 providing the generative sections quality control through the lightweight quality check models 742. In various implementations, the lightweight quality check models 742 includes a set of lightweight neural networks and/or heuristic frameworks that the generative document system 210 uses to curate the generative sections into publish-ready responses. For example, the lightweight quality check models 742 include a deduplication model, a hallucination detection model, a responsible AI model, and a broken link model among other models. The generative document system 210 utilizes the lightweight quality check models 742 to ensure that quality control measurements and metrics are satisfied.

Act 712 includes deduplicating content. For example, the generative sections are provided to a deduplication model or algorithm, which detects and removes duplicative content, if necessary. Act 714 includes enforcing responsible AI measures. For instance, the generative sections are provided to a responsible AI model or algorithm that enforces safety policies and procedures.

Act 716 includes excluding inaccurate content. For example, the generative sections are provided to a hallucination detection model to check for and remove inaccurate content. Act 718 includes removing bad image links. For instance, the generative sections are provided to a broken link model that detects bad image links and removes them from their generative sections. In various implementations, the generative document system 210 utilizes additional lightweight models or algorithms to further enforce quality control measurements within the topic sections.

Act 720 includes returning the curated content in the generative sections to the generative document system 210. In cases where the generative document system 210 implements the lightweight quality check models or algorithms locally, the generative document system 210 stores the curated generative sections.

Figure 8:
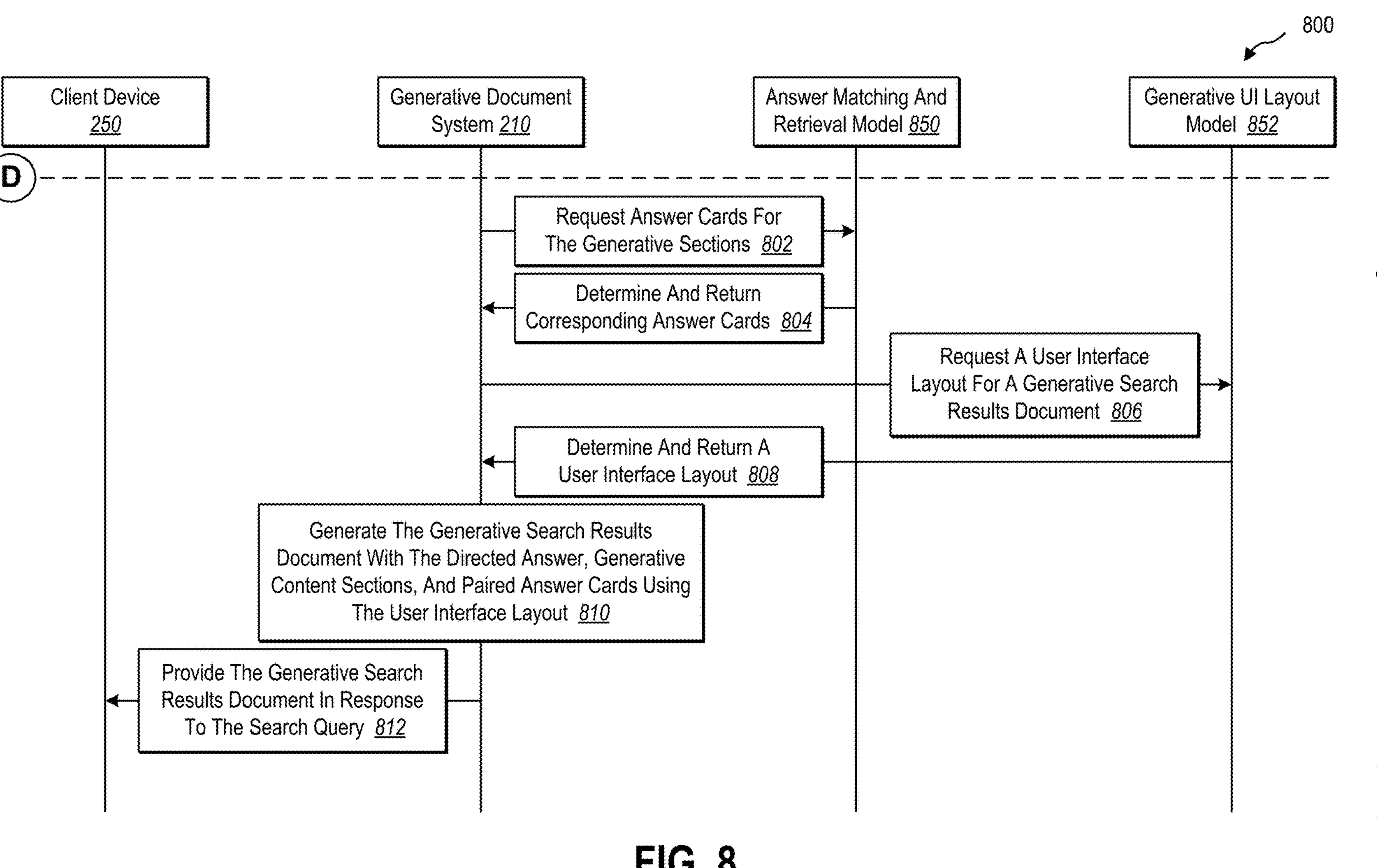
FIG. 8 illustrates an example sequence diagram for creating and providing the generative document in response to the search query.

As mentioned above, FIG. 8 provides additional details about generating and providing the generative search results document. In particular, FIG. 8 illustrates an example sequence diagram for creating and providing the generative document in response to the search query according to some implementations. As shown, FIG. 8 includes a series of acts 800 performed by, or under the direction of, the generative document system 210 in connection with an answer matching and retrieval model 850, a generative UI layout model 852, and the client device 250.

The series of acts 800 corresponds to act 380 introduced above in FIG. 3. The series of acts 800 also continues from act 370, as indicated by Checkpoint D. For instance, the generative document system 210 has obtained a curated version of the generative sections.

Act 802 includes the generative document system 210 requesting answer cards for the generative sections from the answer matching and retrieval model 850. In various implementations, the answer matching and retrieval model 850 is a lightweight model. In some instances, the answer matching and retrieval model 850 is a small generative AI model.

In many implementations, the answer matching and retrieval model 850 identifies answer cards. To illustrate, the answer matching and retrieval model 850 maintains or accesses a set or list of answer cards that include succinct and/or dynamic answers to commonly searched topics. In some implementations, the answer matching and retrieval model 850 matches answer cards to one or more of the topic sections when a match is determined. Accordingly, the answer matching and retrieval model 850 determines and returns the corresponding answer cards, as shown in act 804.

Act 806 includes the generative document system 210 requesting a user interface layout for a generative search results document from the generative UI layout model 852. In some instances, the generative document system 210 provides the directed answer and the curated generative sections to the generative UI layout model 852. In some instances, the generative document system 210 provides the enhanced search link results to the generative UI layout model 852.

In various implementations, the generative UI layout model 852 is a model or algorithm that utilizes heuristics to generate an optimal user interface layout for presenting the directed answer and the generative sections in an organized, streamlined, and natural manner. For example, given the text, images, and other content of the generative sections, the generative UI layout model 852 determines a user interface layout. The layout may indicate locations, styles, dynamic elements, and/or other components for publishing a generative document. In some instances, the generative sections are ranked and the generative UI layout model 852 maintains the section ranking for the user interface layout. Accordingly, the generative UI layout model 852 determines a user interface layout and returns it to the generative document system 210, as shown in act 808.

Act 810 includes the generative document system 210 generating the generative search results document with the directed answer, generative content section, and paired answer card using the user interface layout. In various implementations, the generative document system 210 utilizes the user interface layout to create the generative search results document according to the layout provided by the generative UI layout model 852. For example, the user interface layout indicates information for creating a generative search results document with the directed answer and the generative content section featuring embedded answer cards.

Act 812 includes the generative document system 210 providing the generative search results document to the client device 250 in response to the search query. In various implementations, the generative search results document is displayed as part of a search results page that includes enhanced search link results. As mentioned above, by using small generative AI models, lightweight neural networks, and heuristic models, the generative document system 210 can provide the generative search results document within 10 seconds.

Figure 9A:
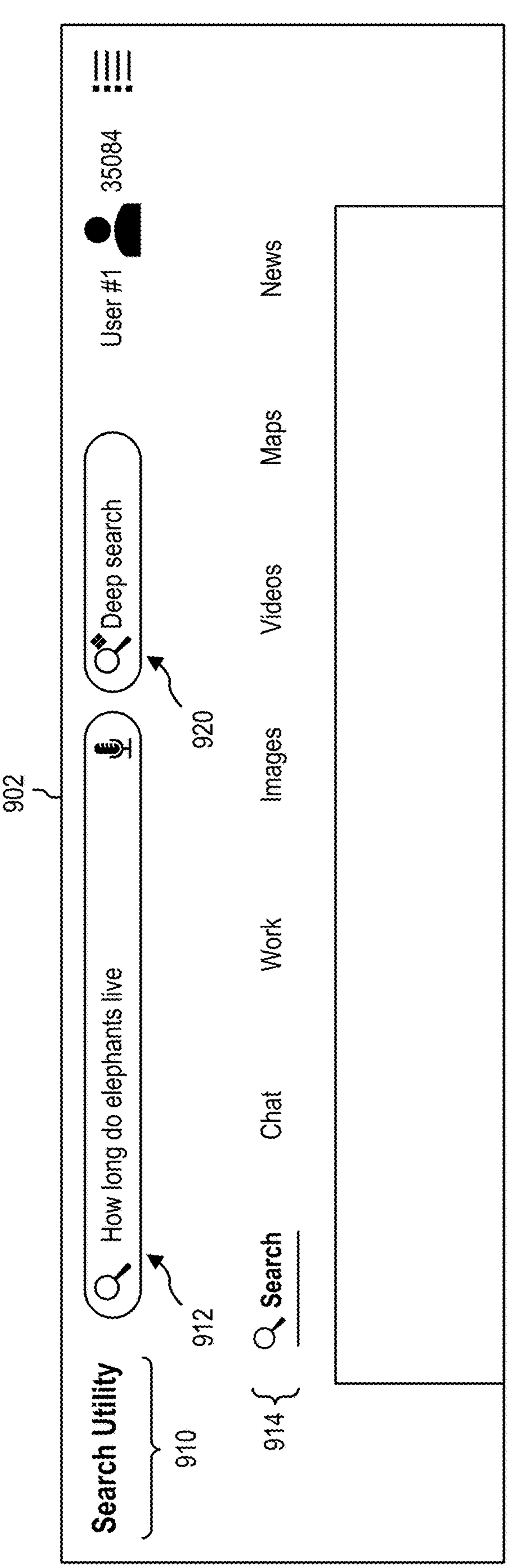
FIGS. 9A-9C illustrate an example graphical user interface flow for providing a generative document in response to a search query.
Figure 9B:
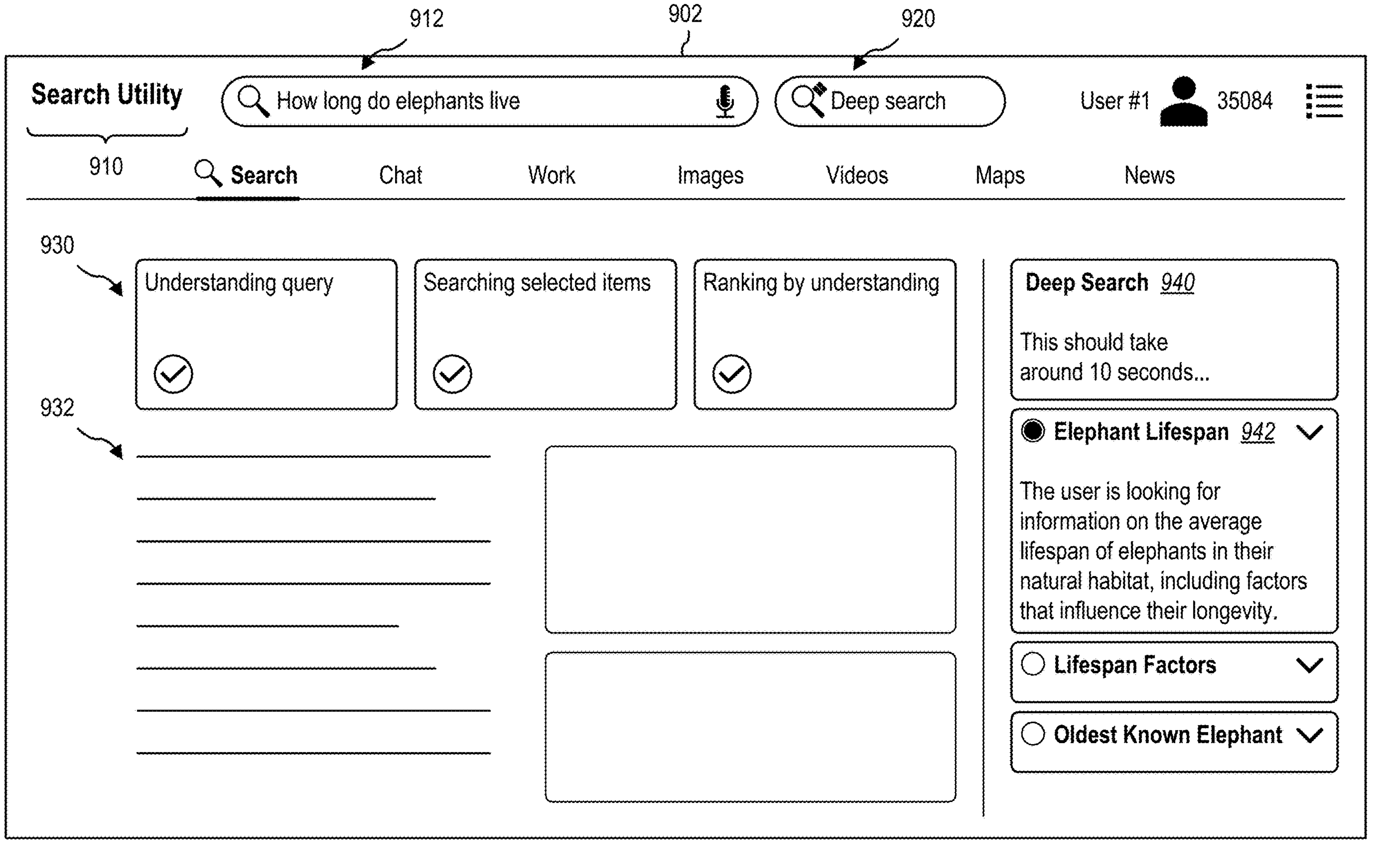
Figure 9C:
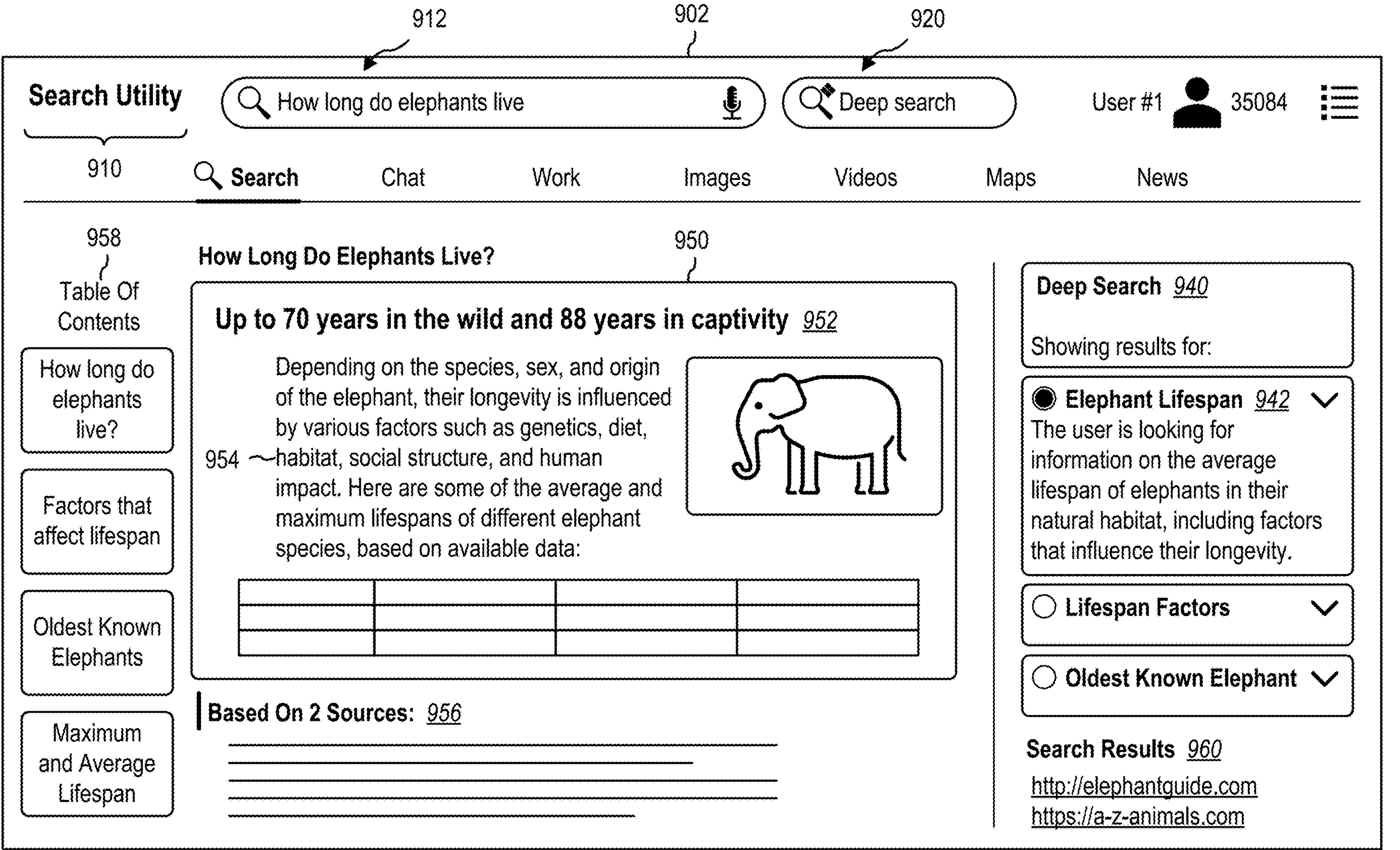

FIGS. 9A-9C illustrate an example graphical user interface flow for providing a generative document in response to a search query. FIGS. 9A-9C include a graphical user interface 902 provided by a client application on a client device. The client application allows a user to interact with a search query system and/or the generative document system to receive a generative search results document for a search query. For instance, the client application can be a web browser that enables a user to submit search queries.

Beginning with FIG. 9A, the graphical user interface 902 of the client application displays a header portion of a search utility 910. The header portion also includes links to other browsing tools 914.

In various implementations, the search utility 910 includes an Internet search engine, a file storage search utility, an email search utility, or a document storage search utility. The search utility 910 includes a search field 912 where a user can enter a search query. In response to a search query, the generative document updates to display a set of initial search link results. The search utility 910 also includes a deep search option 920 for providing enhanced search link results.

In FIG. 9A, a user provides a search query in the search field 912. Additionally, the user selects the deep search option 920. In response, the search utility 910 provides the search query to the generative document system 210 for processing. Specifically, the generative document system 210 begins determining enhanced search link results (e.g., via deep search) and determining to create a generative search results document for the search query, as described above.

FIG. 9B shows the search utility 910 updating to indicate that a deep search is occurring. To illustrate, the search utility 910 now includes a deep search progress tracker 930 indicating the steps the generative document is taking to obtain the enhanced search link results. As shown, the steps correspond with the deep search process and the small generative AI models described above (e.g., using the small generative AI fan-out model and the small generative AI ranking model). The search utility 910 also includes a deep search status indicator 940 providing timing requirements for obtaining the enhanced search link results. Additionally, the search utility 910 includes a selectable intent display field 942, which dynamically updates as the deep search progresses to indicate the discovery of alternative search queries and topics related to the search query.

The search utility 910 also shows a generative document placeholder 932 that is populated with the generative document once created. As mentioned earlier, if the generative document system 210 determines not to create a generative document, the search utility 910 does not include the generative document placeholder 932.

FIG. 9C shows the search utility 910 updated to display the generative search results document 950. As stated, the generative search results document 950 serves as a carefully curated document based on the enhanced search link results 960, which are generated by leveraging a series of small generative models, often concurrently. The generative document facilitates quick comprehension of the search query in a narrative and interactive form that synthesizes the content in the enhanced search link results.

The document includes the directed answer 952 and a generative section 954. The generative section 954 includes a text narrative, images, and a table. The content in the generative section 954 is supported by cited links included as sources 956. While not shown, the generative search results document 950 can display additional sections. For example, the interactive section panel 958 on the left shows other generative sections of the generative search results document 950.

In various implementations, the generative search results document 950 continues to expand as the user interacts with the dynamic elements of the generative document. For example, the generative section 954 provides a first level of detail along with an option to explore the topic further. If the option is selected, the topic section expands to display additional content.

In some implementations, the generative section 954 includes an answer card. Answer cards may include images, graphics, text, and/or links. In some instances, an answer card includes an add-on query. In various instances, an answer card also links to one or more search result links.

The search utility 910 also includes the enhanced search link results 960. In various implementations, the layout of the generative search results page with the generative document varies to show the enhanced search link results in different arrangements. In some implementations, the enhanced search link results 960 may be omitted, located on another page, or selectively appear based on user interaction with corresponding elements of the generative document.

Figure 10:
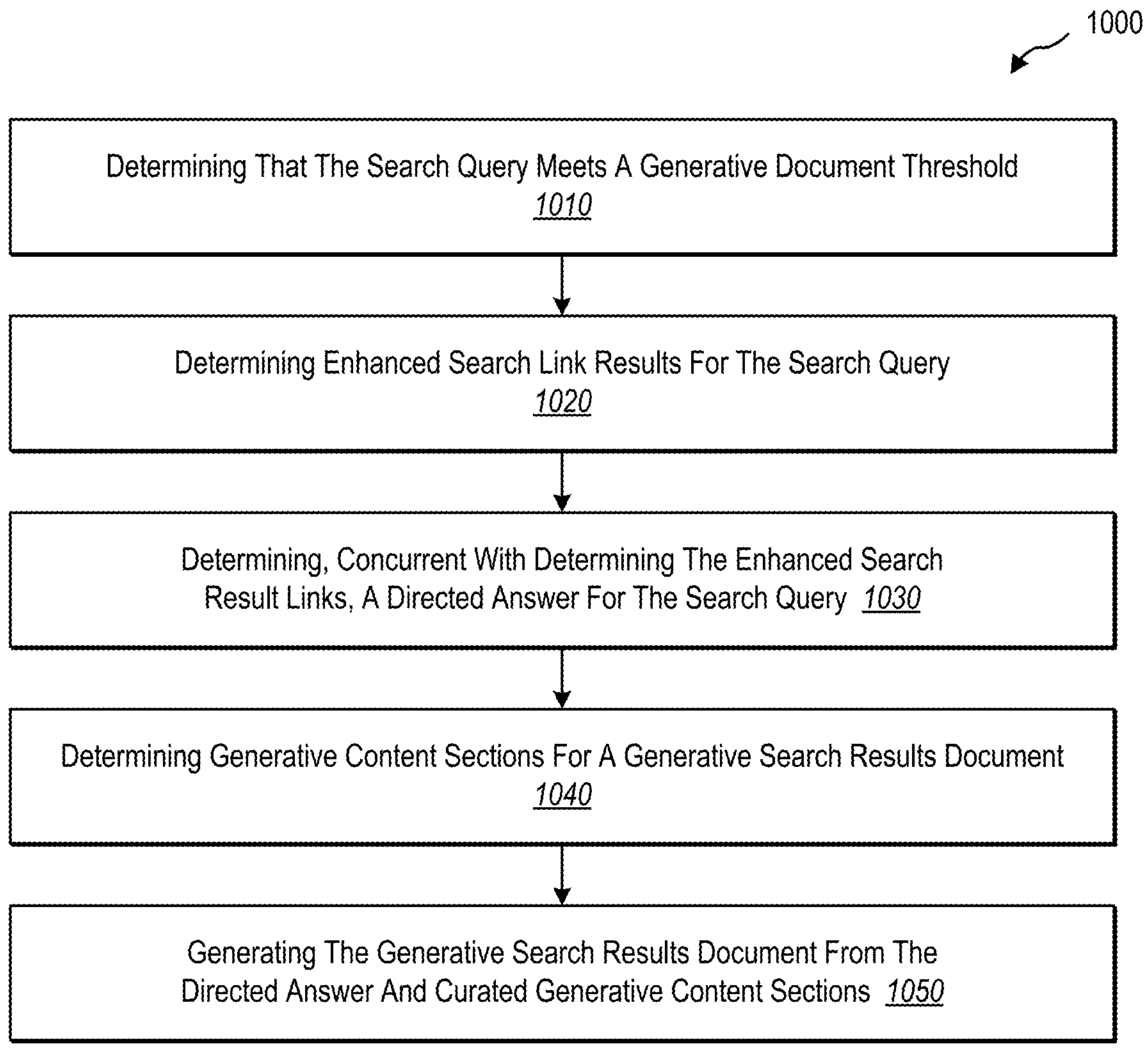
FIG. 10 illustrates an example series of acts of a computer-implemented method for using one or more generative AI models to generate a generative search results document.

Turning now to FIG. 10, this figure illustrates an example series of acts of a computer-implemented method for generating one or more search results documents using one or more AI models according to some implementations. While FIG. 10 illustrates acts according to one or more implementations, alternative implementations may omit, add to, reorder, and/or modify any of the acts shown.

The acts in FIG. 10 can be performed as part of a method (e.g., a computer-implemented method). Alternatively, a computer-readable medium can include instructions that, when executed by a processing system with a processor, cause a computing device to perform the acts in FIG. 10. In some implementations, a system (e.g., a processing system comprising a processor) can perform the acts in FIG. 10. For example, the system includes a processing system and a computer memory including instructions that, when executed by the processing system, cause the system to perform various actions or steps.

As shown, the series of acts 1000 includes act 1010 of determining that the search query meets a generative document threshold. For instance, in example implementations, act 1010 involves determining that the search query meets a generative document threshold based on receiving a set of initial search link results and a search intent associated with the search query. In one or more implementations, act 1010 includes determining the search intent by providing the set of initial search link results to a first small generative AI model that is fine-tuned to determine search intents from search result sets. In some implementations, the first small generative AI model generates the search intent in less than 2 seconds.

In various implementations, determining that the search query meets the generative document threshold includes generating a search complexity score based on the set of initial search link results based on a search complexity model generated to determine search complexity scores for user queries based on query answerability and determining that the search complexity score for the search query meets the generative document threshold. In some implementations, the search complexity model is a search complexity machine learning model generated to determine search complexity scores for the user queries based on query answerability. In one or more implementations, determining that the search query meets the generative document threshold includes utilizing a heuristic framework to determine whether the search query meets the generative document threshold.

As further shown, the series of acts 1000 includes act 1020 of determining enhanced search link results for the search query. For instance, in example implementations, act 1020 involves determining a set of enhanced search link results for the search query based on the set of initial search link results and the search intent. In one or more implementations, act 1020 includes determining a set of enhanced search link results for the search query based on the set of initial search link results and the search intent using one or more small generative AI models.

In various implementations, determining the set of enhanced search link results includes determining multiple related queries based on the set of initial search link results and the search intent using a second small generative AI model that is fine-tuned to generate related search queries, determining sets of search link results from the multiple related queries using a search index, ranking search results from the sets of search link results using a third small generative AI model that is fine-tuned to score search results based on the search intents, and selecting the set of enhanced search link results from a top number of search results based on ranking.

As further shown, the series of acts 1000 includes act 1030 of determining, concurrent with determining the enhanced search link results, a directed answer for the search query. For instance, in example implementations, act 1030 involves determining, concurrent with determining the set of enhanced search link results, a directed answer for the search query based on the set of initial search link results and the search intent. In some implementations, act 1030 includes determining, concurrent with determining the set of enhanced search link results, a directed answer for the search query based on the set of initial search link results and the search intent using another small generative AI model.

In various implementations, act 1030 includes receiving an additional set of initial search link results associated with an additional search query, determining an additional set of enhanced search link results for the additional search query, determining that the additional search query does not meet the generative document threshold, and providing the additional set of enhanced search link results in response to the search query without generating an additional generative search results document.

In some implementations, determining the directed answer includes generating the directed answer for the search query by providing the search query and the set of initial search link results to a fourth small generative AI model that is fine-tuned to generate short answers from user queries and corresponding search link results. In one or more implementations, the fourth small generative AI model generates the directed answer within 3 seconds. In some instances, calls to the fourth small generative AI model are made concurrently with calls to the second small generative AI model.

As shown further, the series of acts 1000 includes act 1040 of determining generative content sections for a generative search results document. For instance, in example implementations, act 1040 involves determining generative content sections for a generative search results document based on the set of enhanced search link results. In various implementations, act 1040 includes determining generative content sections for a generative search results document based on the set of enhanced search link results utilizing a set of small generative AI models in parallel.

In one or more implementations, determining the generative content sections includes generating a first generative content section from the search query and the set of enhanced search link results using a fifth small generative AI model that is fine-tuned to generate content sections from the user queries and the corresponding search link results. In some implementations, the fifth small generative AI model is called concurrently with calling the fourth small generative AI model. In various implementations, determining the generative content sections includes generating multiple content sections in parallel using multiple instances of the fifth small generative AI model that is fine-tuned to generate content sections from the user queries and the corresponding search link results.

In some implementations, act 1040 includes aggregating multiple curated topic sections received from the fifth small generative AI model into a combined topic section document and deduplicating content within the combined topic section document based on cited search link results in the generative content sections. In some instances, act 1040 includes revising content in the generative content sections based on quality control metrics using lightweight neural networks generated or designed to enforce responsible AI policies, eliminate inaccurate content, and remove bad image links within the generated content.

As shown further, the series of acts 1000 includes act 1050 of generating the generative search results document from the directed answer and curated generative content sections. For instance, in example implementations, act 1050 involves generating the generative search results document by combining the directed answer and curated versions of the generative content sections. In some implementations, act 1050 includes generating the generative search results document by combining the directed answer and curated versions of the generative content sections.

In one or more implementations, generating the generative search results document includes determining a set of answer cards corresponding to content within the generative content sections using a lightweight answer matching neural network and pairing answer cards with corresponding generative content sections. In various implementations, generating the generative search results document includes ordering the generative content sections based on an answer ranking, determining content characteristics of the generative content sections, determining a user interface layout for the generative search results document using a heuristics layout model based on the content characteristics, and generating the generative search results document by populating the user interface layout with the directed answer and the generative content sections.

In various implementations, act 1050 includes receiving the search query from a client device, determining the set of initial search link results using a search index, determining the search intent using a first small generative AI model that is fine-tuned to determine search intents from search result sets, and providing the generative search results document within a webpage to the client device in response to the search query. In some implementations, the webpage includes the generative search results document and links from the set of enhanced search link results. In one or more implementations, the generative search results document is provided to a requesting client device within 10 seconds of receiving the search query from the requesting client device.

Figure 11:
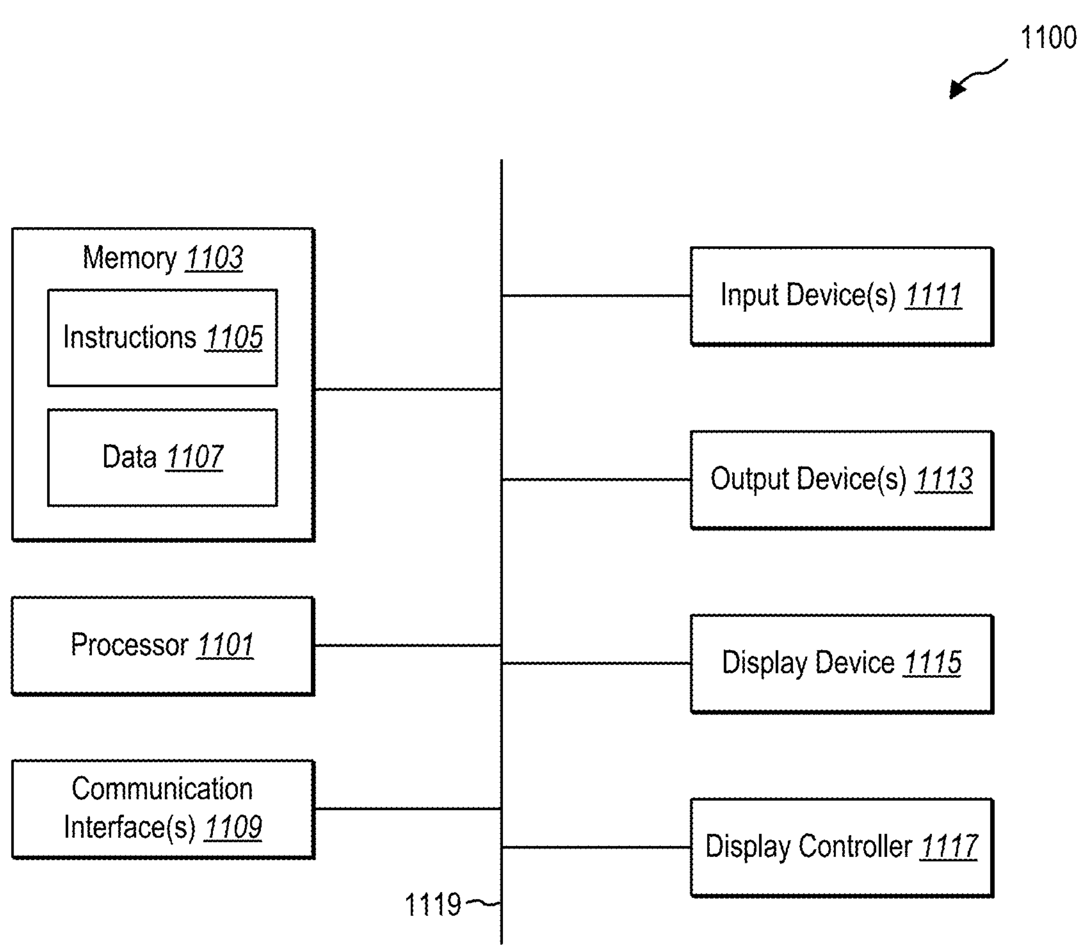
FIG. 11 illustrates example components included within a computer system used to implement the generative document system.

FIG. 11 illustrates certain components that may be included within a computer system 1100. The computer system 1100 may be used to implement the various computing devices, components, and systems described herein (e.g., by performing computer-implemented instructions). As used herein, a "computing device" refers to electronic components that perform a set of operations based on a set of programmed instructions. Computing devices include groups of electronic components, client devices, server devices, etc.

In various implementations, the computer system 1100 represents one or more of the client devices, server devices, or other computing devices described above. For example, the computer system 1100 may refer to various types of network devices capable of accessing data on a network, a cloud computing system, or another system. For instance, a client device may refer to a mobile device such as a mobile telephone, a smartphone, a personal digital assistant (PDA), a tablet, a laptop, or a wearable computing device (e.g., a headset or smartwatch). A client device may also refer to a non-mobile device such as a desktop computer, a server node (e.g., from another cloud computing system), or another non-portable device.

The computer system 1100 includes a processing system including a processor 1101. The processor 1101 may be a general-purpose single- or multi-chip microprocessor (e.g., an Advanced Reduced Instruction Set Computer (RISC) Machine (ARM)), a special-purpose microprocessor (e.g., a digital signal processor (DSP)), a microcontroller, a programmable gate array, etc. The processor 1101 may be referred to as a central processing unit (CPU) and may cause computer-implemented instructions to be performed. Although the processor 1101 shown is just a single processor in the computer system 1100 of FIG. 11, in an alternative configuration, a combination of processors (e.g., an ARM and DSP) could be used.

The computer system 1100 also includes memory 1103 in electronic communication with the processor 1101. The memory 1103 may be any electronic component capable of storing electronic information. For example, the memory 1103 may be embodied as random-access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM), registers, and so forth, including combinations thereof.

The instructions 1105 and the data 1107 may be stored in the memory 1103. The instructions 1105 may be executable by the processor 1101 to implement some or all of the functionality disclosed herein. Executing the instructions 1105 may involve the use of the data 1107 that is stored in the memory 1103. Any of the various examples of modules and components described herein may be implemented, partially or wholly, as instructions 1105 stored in memory 1103 and executed by the processor 1101. Any of the various examples of data described herein may be among the data 1107 that is stored in memory 1103 and used during the execution of the instructions 1105 by the processor 1101.

A computer system 1100 may also include one or more communication interface(s) 1109 for communicating with other electronic devices. The one or more communication interface(s) 1109 may be based on wired communication technology, wireless communication technology, or both. Some examples of the one or more communication interface (s) 1109 include a Universal Serial Bus (USB), an Ethernet adapter, a wireless adapter that operates according to an Institute of Electrical and Electronics Engineers (IEEE) 1102.11 wireless communication protocol, a Bluetooth® wireless communication adapter, and an infrared (IR) communication port.

A computer system 1100 may also include one or more input device(s) 1111 and one or more output device(s) 1113. Some examples of the one or more input device(s) 1111 include a keyboard, mouse, microphone, remote control device, button, joystick, trackball, touchpad, and light pen. Some examples of the one or more output device(s) 1113 include a speaker and a printer. A specific type of output device that is typically included in a computer system 1100 is a display device 1115. The display device 1115 used with implementations disclosed herein may utilize any suitable image projection technology, such as liquid crystal display (LCD), light-emitting diode (LED), gas plasma, electroluminescence, or the like. A display controller 1117 may also be provided, for converting data 1107 stored in the memory 1103 into text, graphics, and/or moving images (as appropriate) shown on the display device 1115.

The various components of the computer system 1100 may be coupled together by one or more buses, which may include a power bus, a control signal bus, a status signal bus, a data bus, etc. For clarity, the various buses are illustrated in FIG. 11 as a bus system 1119.

This disclosure describes a subjective data application system in the framework of a network. In this disclosure, a "network" refers to one or more data links that enable electronic data transport between computer systems, modules, and other electronic devices. A network may include public networks such as the Internet as well as private networks. When information is transferred or provided over a network or another communication connection (either hardwired, wireless, or both), the computer correctly views the connection as a transmission medium. Transmission media can include a network and/or data links that carry required program code in the form of computer-executable instructions or data structures, which can be accessed by a general-purpose or special-purpose computer. Combinations of the above are also included within the scope of computer-readable media.

In addition, the network described herein may represent a network or a combination of networks (such as the Internet, a corporate intranet, a virtual private network (VPN), a local area network (LAN), a wireless local area network (WLAN), a cellular network, a wide area network (WAN), a metropolitan area network (MAN), or a combination of two or more such networks) over which one or more computing devices may access the various systems described in this disclosure. Indeed, the networks described herein may include one or multiple networks that use one or more communication platforms or technologies for transmitting data. For example, a network may include the Internet or other data link that enables transporting electronic data between respective client devices and components (e.g., server devices and/or virtual machines thereon) of the cloud computing system.

Further, upon reaching various computer system components, program code means in the form of computer-executable instructions or data structures can be transferred automatically from transmission media to non-transitory computer-readable storage media (devices), or vice versa. For example, computer-executable instructions or data structures received over a network or data link can be buffered in random-access memory (RAM) within a network interface module (NIC), and then it is eventually transferred to computer system RAM and/or to less volatile computer storage media (devices) at a computer system. Thus, it should be understood that computer-readable storage media (devices) can be included in computer system components that also (or even primarily) utilize transmission media.

Computer-executable instructions include instructions and data that, when executed by a processor, cause a general-purpose computer, special-purpose computer, or special-purpose processing device to perform a certain function or group of functions. In some implementations, computer-executable and/or computer-implemented instructions are executed by a general-purpose computer to turn the general-purpose computer into a special-purpose computer implementing elements of the disclosure. The computer-executable instructions may include, for example, binaries, intermediate format instructions such as assembly language, or even source code. Although the subject matter has been described in language specific to structural features and/or methodological acts, it is to be understood that the subject matter defined in the appended claims is not necessarily limited to the features or acts described above. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or a combination of hardwired and wireless data links) through a network, both perform tasks. In a distributed system environment, program modules may be located in both local and remote memory storage devices.

The techniques described herein may be implemented in hardware, software, firmware, or any combination thereof unless specifically described as being implemented in a specific manner. Any features described as modules, components, or the like may also be implemented together in an integrated logic device or separately as discrete but interoperable logic devices. If implemented in software, the techniques may be realized at least in part by a non-transitory processor-readable storage medium, including instructions that, when executed by at least one processor, perform one or more of the methods described herein (including computer-implemented methods). The instructions may be organized into routines, programs, objects, components, data structures, etc., which may perform particular tasks and/or implement particular data types, and which may be combined or distributed as desired in various implementations.

Computer-readable media can be any available media that can be accessed by a general-purpose or special-purpose computer system. Computer-readable media that store computer-executable instructions are non-transitory computer-readable storage media (devices). Computer-readable media that carry computer-executable instructions are transmission media. Thus, by way of example, implementations of the disclosure can include at least two distinctly different kinds of computer-readable media: non-transitory computer-readable storage media (devices) and transmission media.

As used herein, computer-readable storage media (devices) may include RAM, ROM, EEPROM, CD-ROM, solid-state drives (SSDs) (e.g., based on RAM), Flash memory, phase-change memory (PCM), other types of memory, other optical disk storage, magnetic disk storage or other magnetic storage devices, or any other medium which can be used to store desired program code means in the form of computer-executable instructions or data structures and which can be accessed by a general-purpose or special-purpose computer.

The steps and/or actions of the methods described herein may be interchanged with one another without departing from the scope of the claims. In other words, unless a specific order of steps or actions is required for the proper operation of the method that is being described, the order and/or use of specific steps and/or actions may be modified without departing from the scope of the claims.

The term "determining" encompasses a wide variety of actions and, therefore, "determining" can include calculating, computing, processing, deriving, investigating, looking up (e.g., looking up in a table, a data repository, or another data structure), ascertaining, and the like. Also, "determining" can include receiving (e.g., receiving information), accessing (e.g., accessing data in a memory), and the like. Also, "determining" can include resolving, selecting, choosing, establishing, and the like.

The terms "comprising," "including," and "having" are intended to be inclusive and mean that there may be additional elements other than the listed elements. Additionally, it should be understood that references to "one implementation" or "implementations" of the present disclosure are not intended to be interpreted as excluding the existence of additional implementations that also incorporate the recited features. For example, any element or feature described concerning an implementation herein may be combinable with any element or feature of any other implementation described herein, where compatible.

The present disclosure may be embodied in other specific forms without departing from its spirit or characteristics. The described implementations are to be considered illustrative and not restrictive. The scope of the disclosure is indicated by the appended claims rather than by the foregoing description. Changes that come within the meaning and range of equivalency of the claims are to be embraced within their scope.

What is claimed is:

1. A computer-implemented method for generating one or more search results documents using one or more artificial intelligence (AI) models, comprising:

based on receiving a set of initial search link results and a search intent associated with a search query, determining that the search query meets a generative document threshold for creation of a generative search results document;

determining a set of enhanced search link results for the search query based on the set of initial search link results and the search intent;

determining, concurrent with determining the set of enhanced search link results, a directed answer for the search query based on the set of initial search link results and the search intent;

determining generative content sections for a generative search results document based on the set of enhanced search link results; and generating the generative search results document by combining the directed answer and curated versions of the generative content sections.

2. The computer-implemented method of claim 1, wherein determining that the search query meets the generative document threshold includes:

generating a search complexity score based on the set of initial search link results based on a search complexity model generated to determine search complexity scores for user queries based on query answerability; and determining that the search complexity score for the search query meets the generative document threshold.

3. The computer-implemented method of claim 2, wherein the search complexity model is a search complexity machine learning model generated to determine search complexity scores for the user queries based on query answerability.

4. The computer-implemented method of claim 1, wherein determining that the search query meets the generative document threshold includes utilizing a heuristic framework to determine whether the search query meets the generative document threshold.

5. The computer-implemented method of claim 1, further comprising:
- receiving an additional set of initial search link results associated with an additional search query;
- determining an additional set of enhanced search link results for the additional search query;
- determining that the additional search query does not meet the generative document threshold; and
- providing the additional set of enhanced search link results in response to the search query without generating an additional generative search results document.

6. The computer-implemented method of claim 1, further comprising determining the search intent by providing the set of initial search link results to a first small generative AI model that is fine-tuned to determine search intents from search result sets.

7. The computer-implemented method of claim 6, wherein determining the set of enhanced search link results includes:
- determining multiple related queries based on the set of initial search link results and the search intent using a second small generative AI model that is fine-tuned to generate related search queries;
- determining sets of search link results from the multiple related queries using a search index;
- ranking search results from the sets of search link results using a third small generative AI model that is fine-tuned to score search results based on the search intents; and
- selecting the set of enhanced search link results from a top number of search results based on ranking.

8. The computer-implemented method of claim 7, wherein:
- determining the directed answer includes generating the directed answer for the search query by providing the search query and the set of initial search link results to a fourth small generative AI model that is fine-tuned to generate short answers from user queries and corresponding search link results; and
- calls to the fourth small generative AI model are made concurrently with calls to the second small generative AI model.

9. The computer-implemented method of claim 8, wherein determining the generative content sections includes generating a first generative content section from the search query and the set of enhanced search link results using a fifth small generative AI model that is fine-tuned to generate content sections from the user queries and the corresponding search link results.

10. The computer-implemented method of claim 9, wherein the fifth small generative AI model is called concurrently with calling the fourth small generative AI model.

11. The computer-implemented method of claim 8, wherein determining the generative content sections includes generating multiple content sections in parallel using multiple instances of a fifth small generative AI model that is fine-tuned to generate content sections from the user queries and the corresponding search link results.

12. The computer-implemented method of claim 11, further comprising:
- combining multiple curated topic sections received from the fifth small generative AI model into a combined topic section document; and
- deduplicating content within the combined topic section document based on cited search link results in the generative content sections.

13. The computer-implemented method of claim 11, further comprising revising content in the generative content sections based on quality control metrics using lightweight neural networks generated to enforce responsible AI policies, eliminate inaccurate content, and remove bad image links within generated content.

14. The computer-implemented method of claim 1, wherein generating the generative search results document includes:
- determining a set of answer cards corresponding to content within the generative content sections using a lightweight answer matching neural network; and
- pairing answer cards with corresponding generative content sections.

15. The computer-implemented method of claim 1, wherein generating the generative search results document includes:
- ordering the generative content sections based on an answer ranking;
- determining content characteristics of the generative content sections;
- determining a user interface layout for the generative search results document using a heuristics layout model based on the content characteristics; and
- generating the generative search results document by populating the user interface layout with the directed answer and the generative content sections.

16. A system comprising:
- a processing system; and
- a computer memory comprising instructions that, when executed by the processing system, cause the system to perform operations of:
  - based on receiving a set of initial search link results and a search intent associated with a search query, determining that a search complexity score for the search query meets a generative document threshold for creation of a generative search results document, the search complexity score based on the set of initial search link results;
  - determining a set of enhanced search link results for the search query based on the set of initial search link results and the search intent;
  - determining, concurrent with determining the set of enhanced search link results, a directed answer for the search query based on the set of initial search link results and the search intent;
  - determining generative content sections for a generative search results document based on the set of enhanced search link results; and
  - generating the generative search results document by combining the directed answer and curated versions of the generative content sections.

17. The system of claim 16, further comprising:
- receiving the search query from a client device;
- determining the set of initial search link results using a search index;
- determining the search intent using a first small generative AI model that is fine-tuned to determine search intents from search result sets; and providing the generative search results document within a webpage to the client device in response to the search query.

18. The system of claim 17, wherein the webpage includes the generative search results document and links from the set of enhanced search link results.

19. The system of claim 16, wherein the generative search results document is provided to a requesting client device within 10 seconds of receiving the search query from the requesting client device.

20. A computer-implemented method for generating one or more search results documents using one or more artificial intelligence (AI) models, comprising:

based on receiving a set of initial search link results and a search intent associated with a search query, determining that the search query meets a generative document threshold for creation of a generative search results document;

determining a set of enhanced search link results for the search query based on the set of initial search link results and the search intent using one or more small generative AI models;

determining, concurrent with determining the set of enhanced search link results, a directed answer for the search query based on the set of initial search link results and the search intent using another small generative AI model;

determining generative content sections for a generative search results document based on the set of enhanced search link results utilizing a set of small generative AI models in parallel; and generating the generative search results document by combining the directed answer and curated versions of the generative content sections.

* * * * *